(12) United States Patent
Tokuda

(10) Patent No.: US 10,809,553 B2
(45) Date of Patent: Oct. 20, 2020

(54) FLEXIBLE SUBSTRATE

(71) Applicant: Japan Display Inc., Tokyo (JP)

(72) Inventor: Naoki Tokuda, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/780,993

(22) Filed: Feb. 4, 2020

(65) Prior Publication Data

US 2020/0174305 A1 Jun. 4, 2020

Related U.S. Application Data

(63) Continuation of application No. 16/285,718, filed on Feb. 26, 2019, now Pat. No. 10,591,763, which is a continuation of application No. 15/820,564, filed on Nov. 22, 2017, now Pat. No. 10,254,574.

(30) Foreign Application Priority Data

Dec. 5, 2016 (JP) ................. 2016-235713

(51) Int. Cl.
  *G02F 1/1333* (2006.01)
  *H01L 27/32* (2006.01)
  *H01L 51/00* (2006.01)
  *H05B 33/04* (2006.01)
  *G06F 1/16* (2006.01)
  *H01L 27/12* (2006.01)
  *H05B 45/00* (2020.01)

(52) U.S. Cl.
  CPC .. *G02F 1/133305* (2013.01); *G02F 1/133308* (2013.01); *G06F 1/1652* (2013.01); *H01L 27/12* (2013.01); *H01L 27/1218* (2013.01); *H01L 27/1248* (2013.01); *H01L 27/3258* (2013.01); *H01L 27/3276* (2013.01); *H01L 51/0097* (2013.01); *H05B 33/04* (2013.01); *H05B 45/00* (2020.01); *H01L 2227/323* (2013.01); *H01L 2251/5338* (2013.01)

(58) Field of Classification Search
  CPC ... G02F 1/133305; G02F 2001/133388; G06F 1/1652; H01L 51/0097; H01L 2251/5338; H01L 27/1218; H01L 27/124
  See application file for complete search history.

(56) References Cited

U.S. PATENT DOCUMENTS

| | | | |
|---|---|---|---|
| 7,646,466 B2 * | 1/2010 | Hashimoto | ....... G02F 1/133308 349/158 |
| 9,323,291 B2 * | 4/2016 | Oh | ....... H01L 51/0097 |
| 9,939,699 B2 * | 4/2018 | Park | ....... G02F 1/133305 |

(Continued)

*Primary Examiner* — Scott B Geyer
(74) *Attorney, Agent, or Firm* — Michael Best & Friedrich LLP

(57) ABSTRACT

Provided is a display device having a flexible substrate including an active region and a wiring region. The active region possesses a plurality of pixels each including a display element. The wiring region has a plurality of terminals, and a plurality of wirings extends from the active region to the plurality of terminals. An insulating film included in the active region and extending from the active region has a sidewall between an edge of the flexible substrate and the wiring adjacent to the edge in the wiring region. The sidewall has a curved portion on a plane in which the plurality of wirings is arranged, and a distance between the edge and the curved portion is curvedly varied.

18 Claims, 31 Drawing Sheets

(56) References Cited

U.S. PATENT DOCUMENTS

| | | | |
|---|---|---|---|
| 10,038,154 B2* | 7/2018 | Lee | H01L 27/323 |
| 10,121,988 B2* | 11/2018 | Oh | H01L 51/0097 |
| 10,608,201 B2* | 3/2020 | Kwon | H01L 51/0097 |
| 2001/0017372 A1* | 8/2001 | Koyama | G09G 3/3648 |
| | | | 257/72 |
| 2008/0094561 A1* | 4/2008 | Fan | G02F 1/1333 |
| | | | 349/151 |
| 2009/0185339 A1* | 7/2009 | Kwon | H05K 5/0017 |
| | | | 361/679.21 |
| 2014/0183473 A1* | 7/2014 | Lee | H01L 27/3276 |
| | | | 257/40 |
| 2015/0189717 A1* | 7/2015 | Kuranaga | H01L 51/5246 |
| | | | 313/511 |
| 2015/0280127 A1* | 10/2015 | Suzuki | H01L 51/0097 |
| | | | 438/33 |
| 2018/0190631 A1* | 7/2018 | Kim | G02F 1/13452 |

* cited by examiner

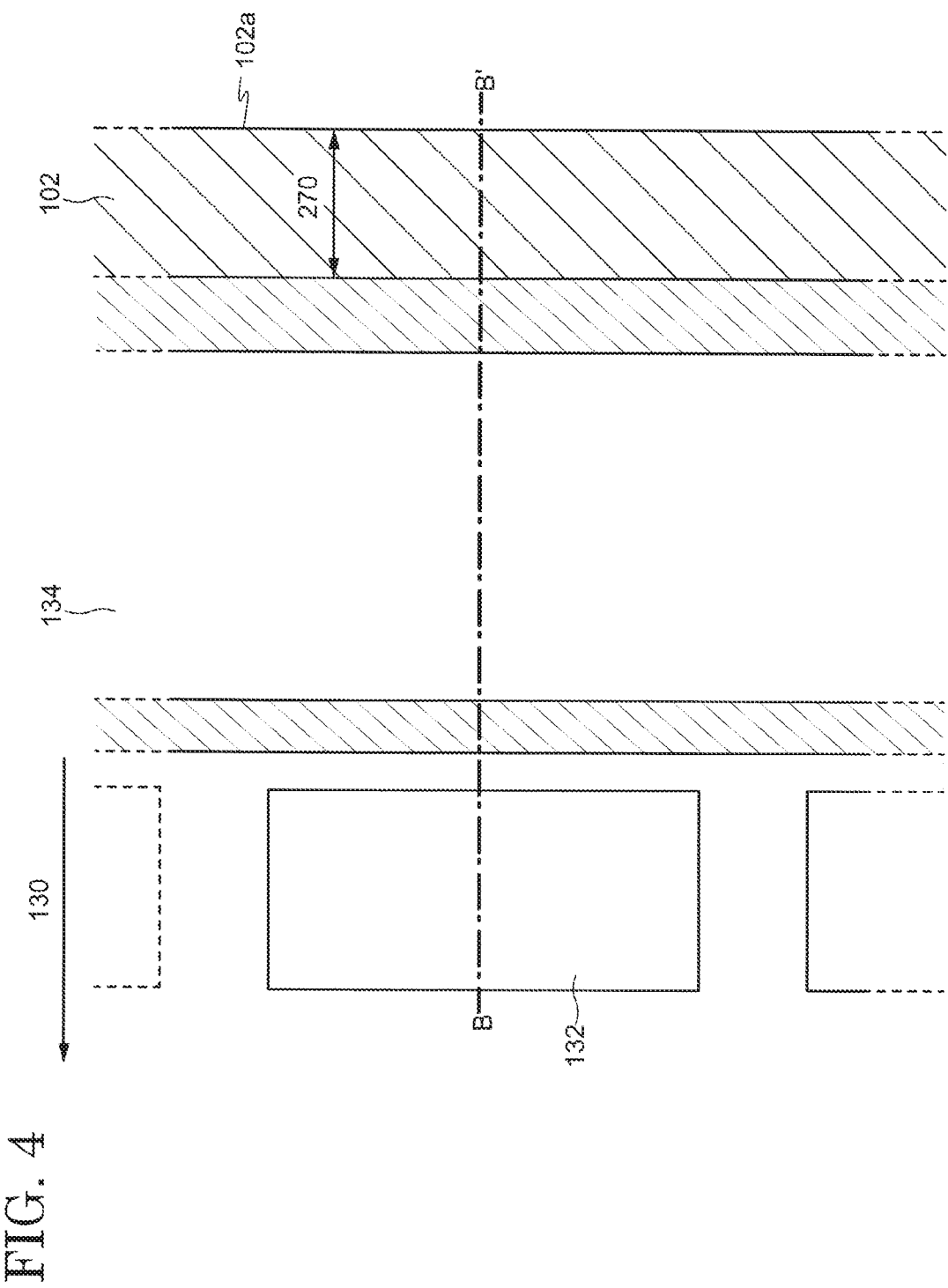

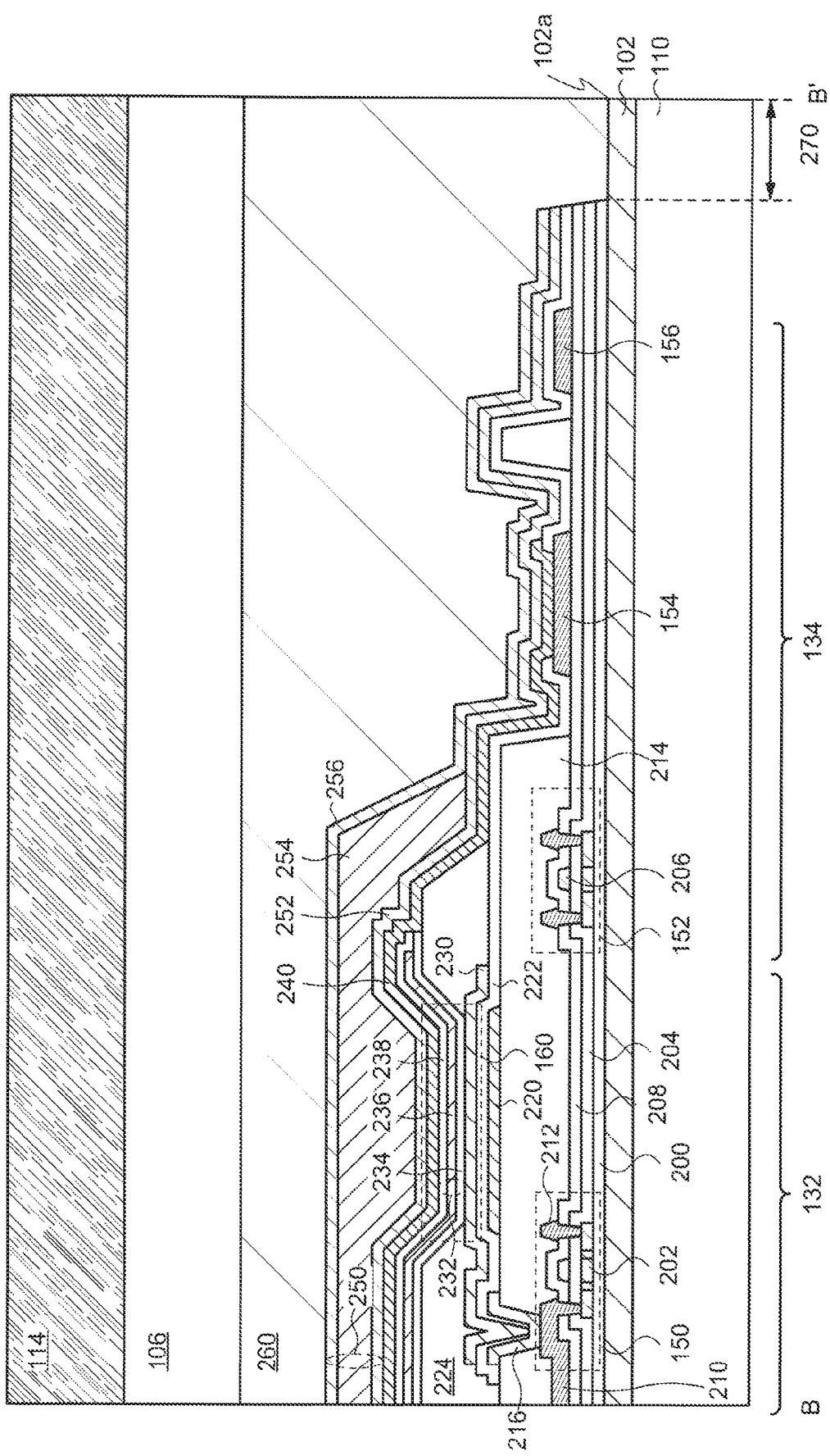

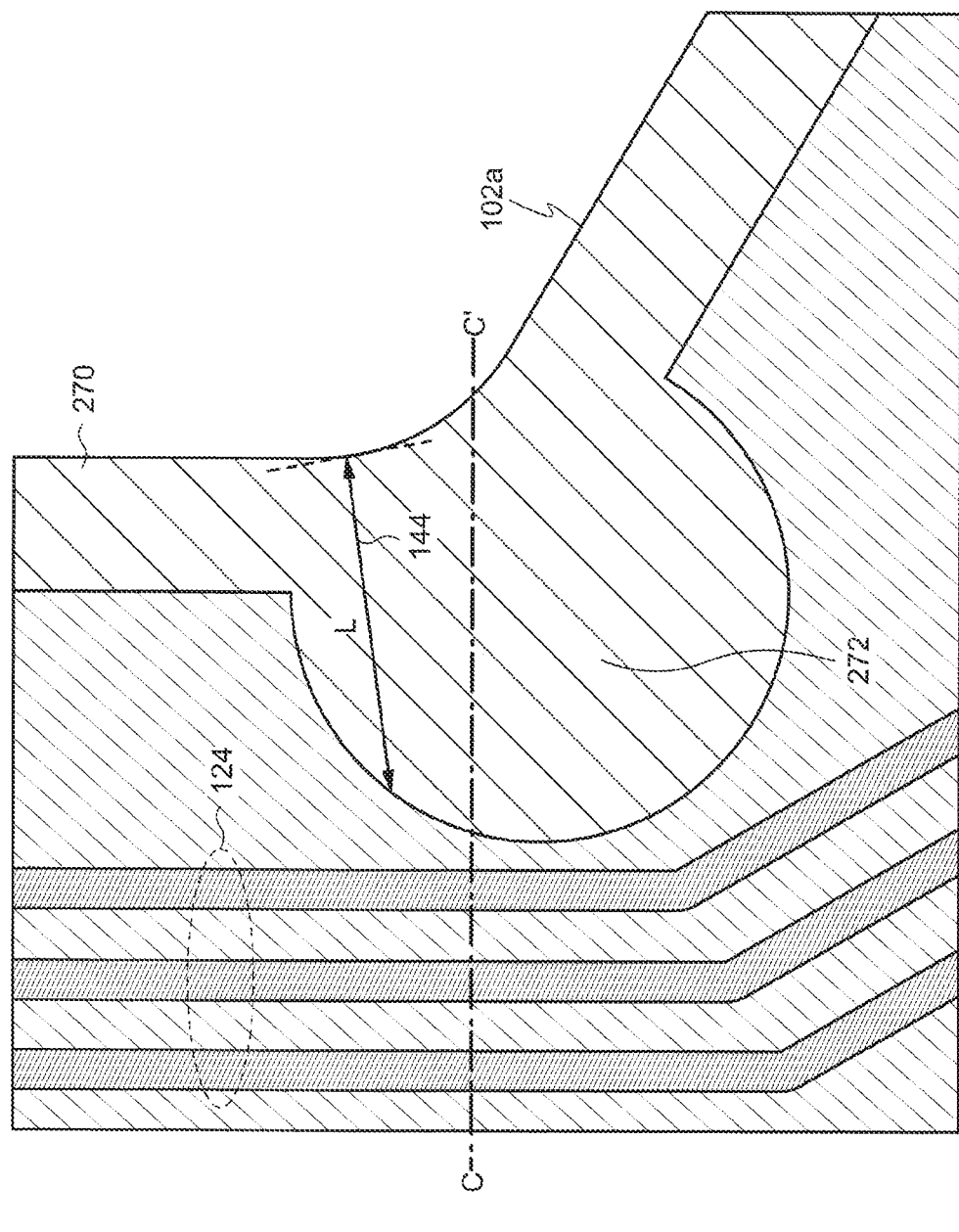

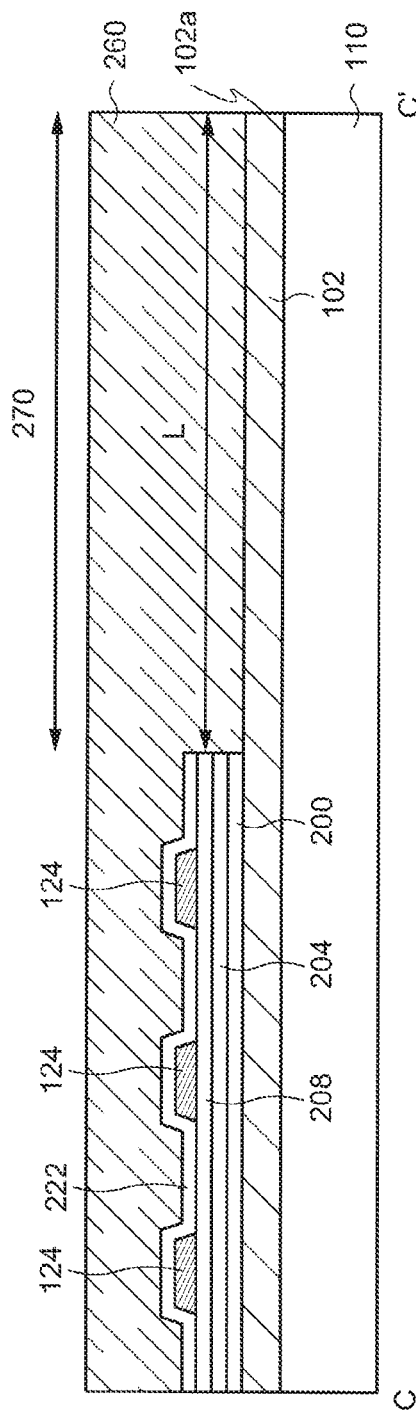
FIG. 8A
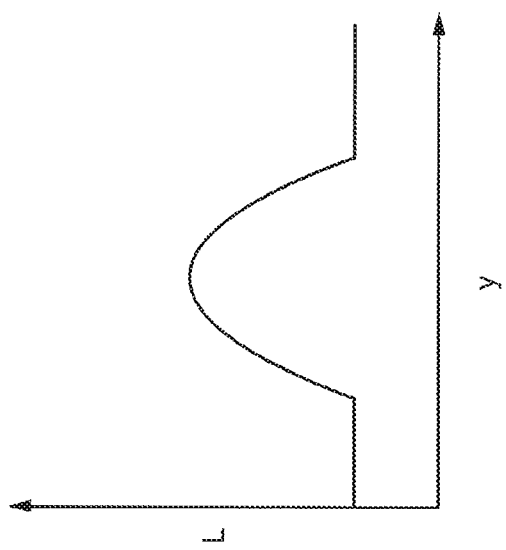
FIG. 8B
FIG. 8C

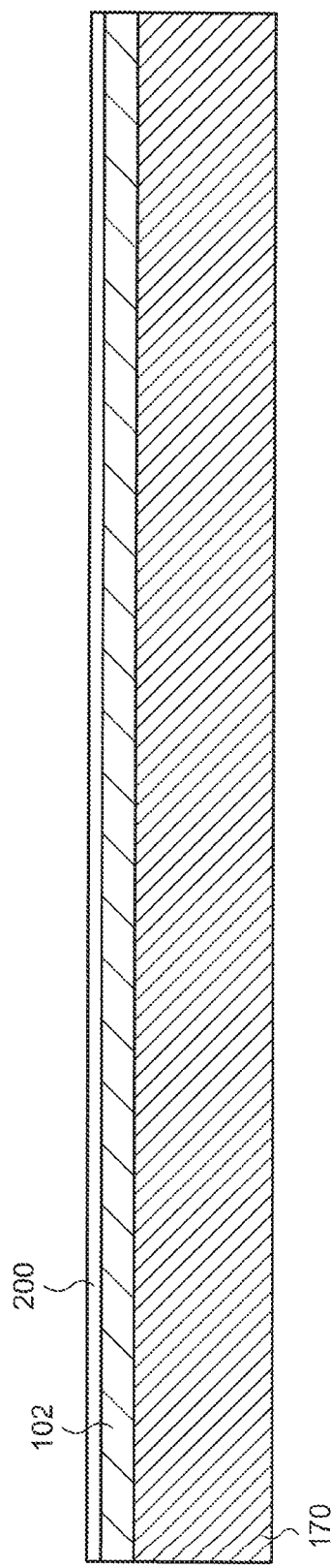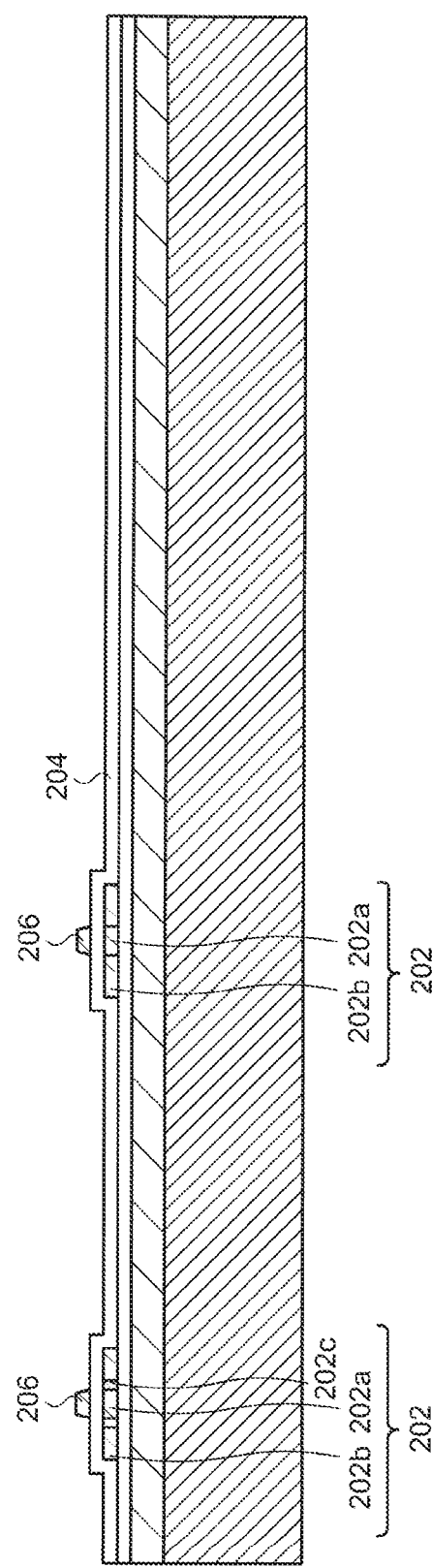

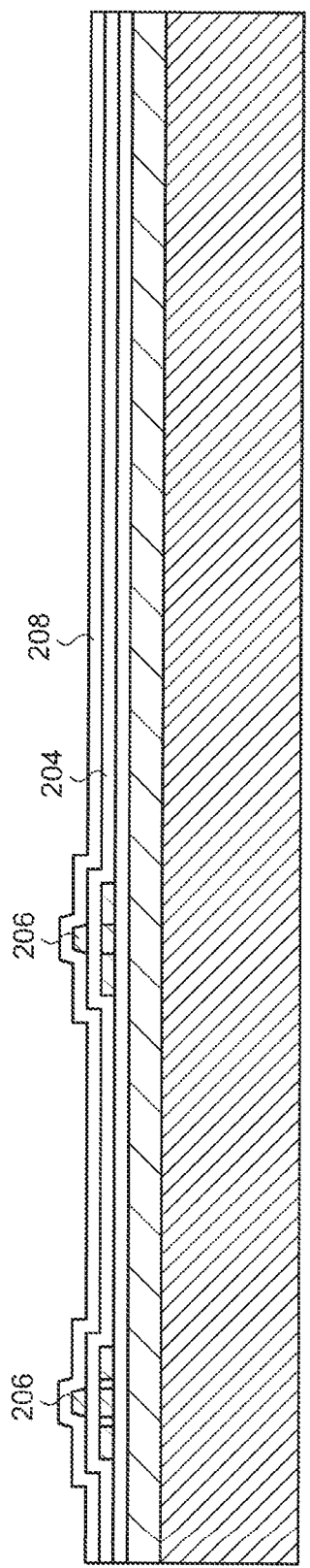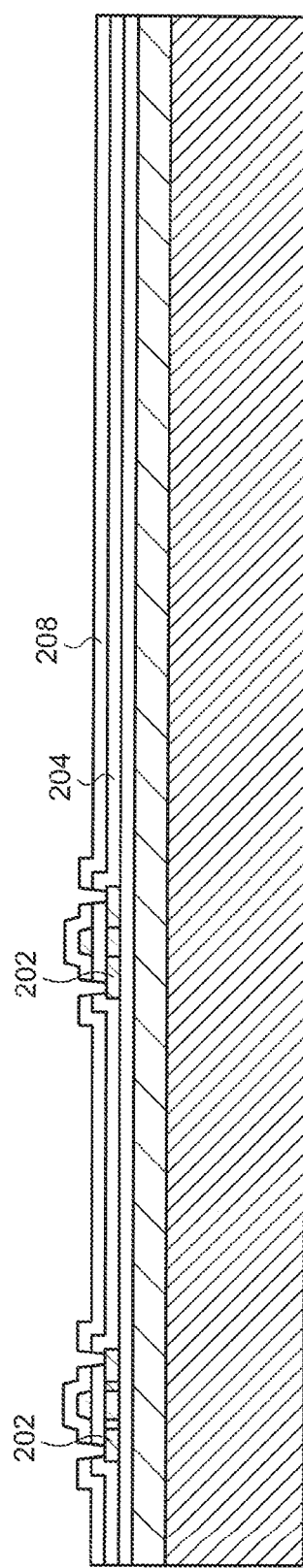

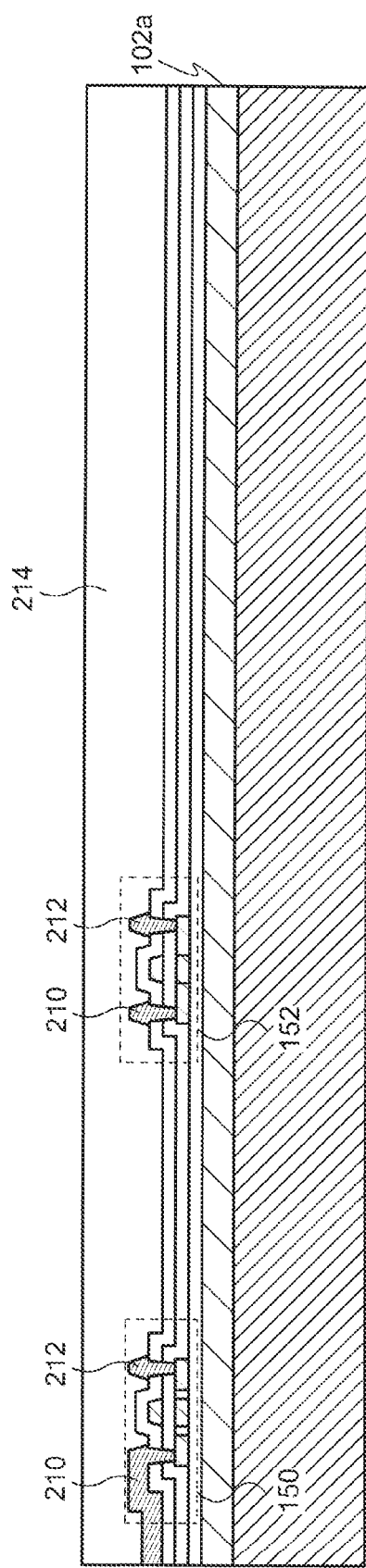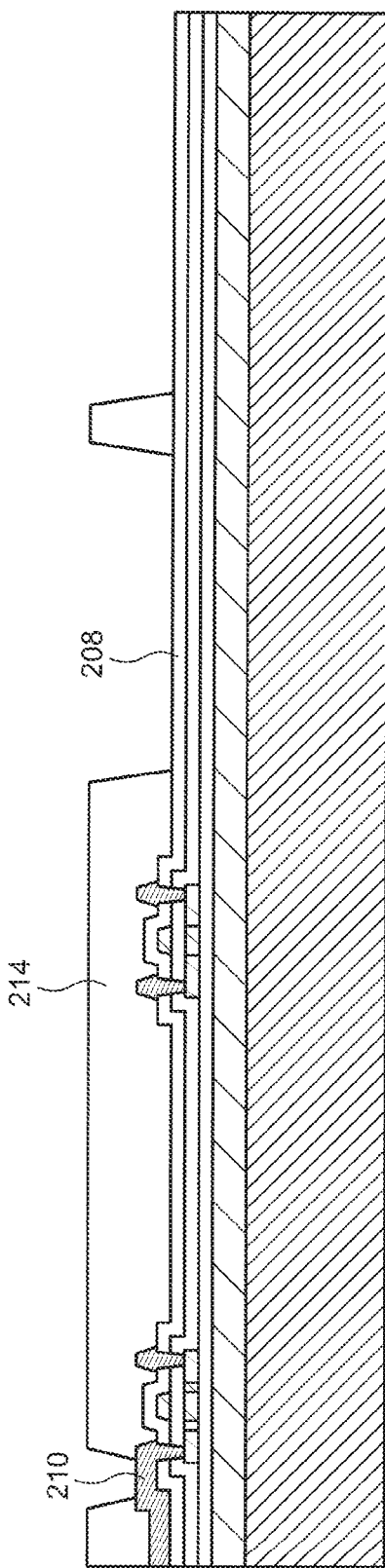

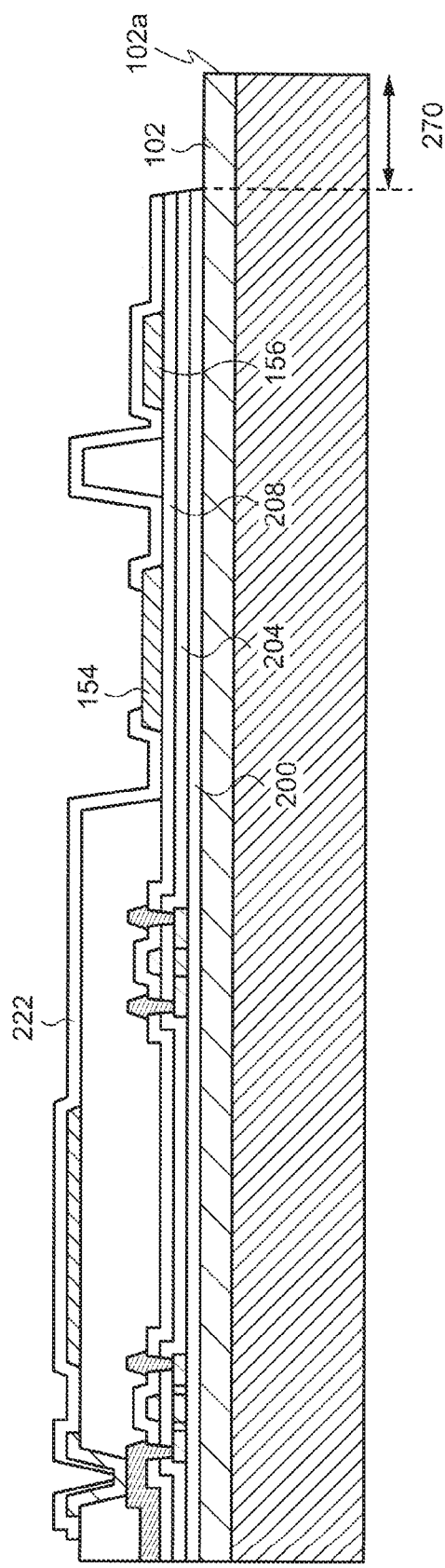
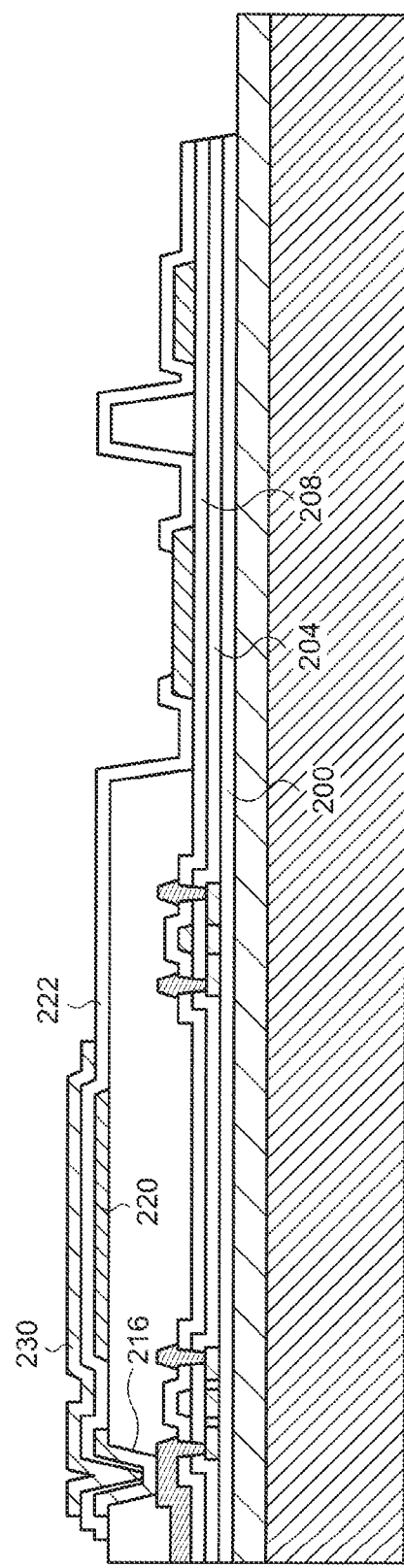

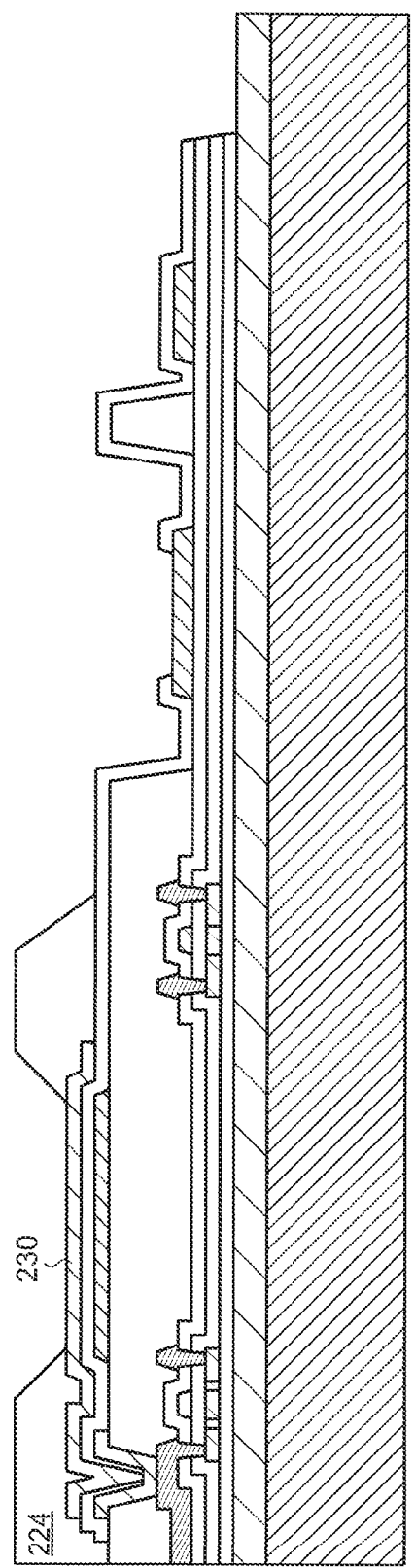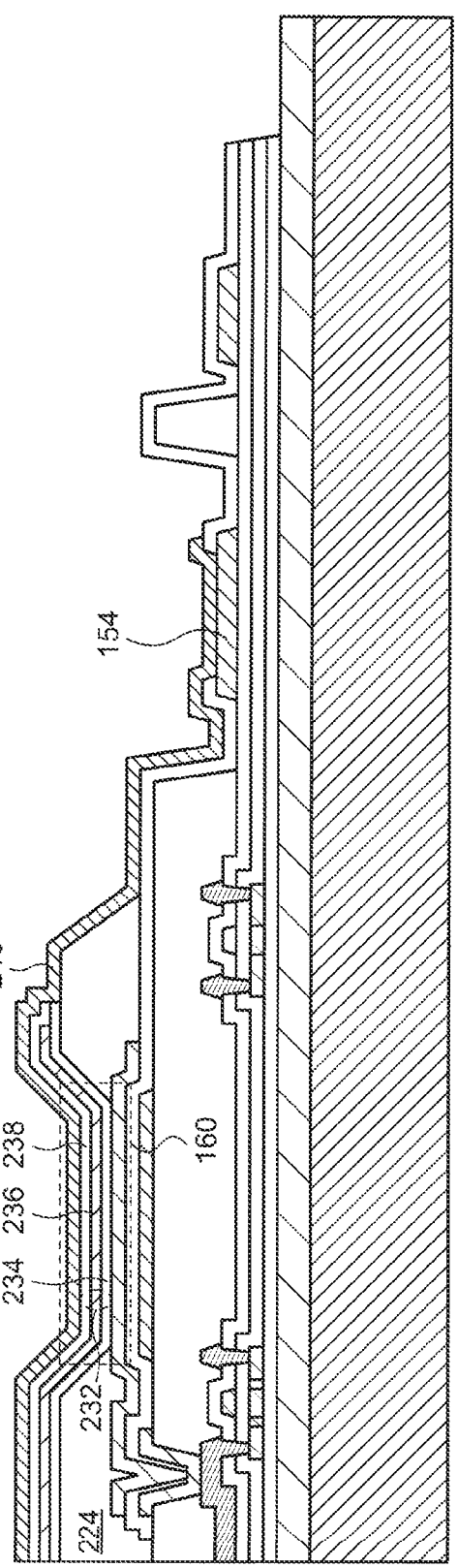

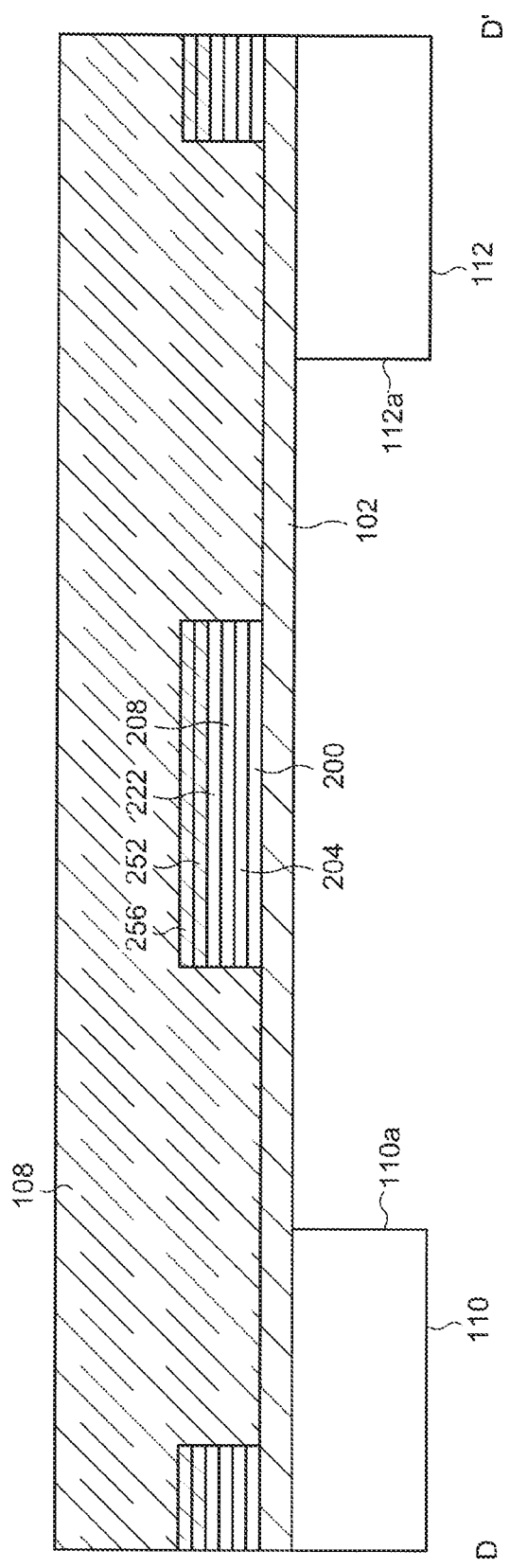

FLEXIBLE SUBSTRATE

CROSS REFERENCE TO RELATED APPLICATIONS

This application is a continuation of U.S. patent application Ser. No. 16/285,718, filed on Feb. 26, 2019, which, in turn, is a continuation of U.S. patent application Ser. No. 15/820,564 (now U.S. Pat. No. 10,254,574), filed on Nov. 22, 2017. Further, this application is based on and claims the benefit of priority from the prior Japanese Patent Application No. 2016-235713, filed on Dec. 5, 2016, the entire contents of which are incorporated herein by reference.

FIELD

An embodiment of the present invention relates to a flexible display device and a manufacturing method thereof. For example, an embodiment of the present invention relates to a flexible display device having high reliability and a method for manufacturing the display device at a high yield.

BACKGROUND

A liquid crystal display device and an organic EL display device are represented as a typical example of a display device. These display devices have a plurality of pixels over a substrate, and a display element such as a liquid crystal element or an organic EL (Electroluminescence) element (hereinafter, referred to as a light-emitting element) is disposed in each pixel. A liquid crystal element and a light-emitting element respectively possess, between a pair of electrodes, a layer including a compound exhibiting liquid crystallinity and a layer (hereinafter, referred to as an EL layer) including an organic compound exhibiting a light-emitting property and are operated by applying a voltage or supplying a current between the pair of electrodes.

A so-called flexible display (sheet display) capable of being bent or folded can be produced by providing flexibility to a substrate of a display device. For example, Japanese patent application publications No. 2015-195106 and 2015-128033 disclose an organic EL display device prepared by using a flexible substrate and a manufacturing method thereof.

SUMMARY

An embodiment of the present invention is a display device having a flexible substrate including an active region and a wiring region. The active region possesses a plurality of pixels each including a display element. The wiring region has a plurality of terminals, and a plurality of wirings extends from the active region to the plurality of terminals. An insulating film included in the active region and extending from the active region has a sidewall between an edge of the flexible substrate and the wiring adjacent to the edge in the wiring region. The sidewall has a curved portion on a plane in which the plurality of wirings is arranged, and a distance between the edge and the curved portion is curvedly varied.

An embodiment of the present invention is a display device having a flexible substrate including an active region and a wiring region. The active region possesses: an undercoat over the flexible substrate; a semiconductor film, a gate, and a gate insulating film sandwiched by the semiconductor film and the gate over the undercoat; an interlayer film over the semiconductor film, the gate, and the gate insulating film; and a source and a drain electrically connected to the semiconductor film. The wiring region possesses: a terminal over the flexible substrate; and a wiring located over the flexible substrate and electrically connecting the active region to the terminal. In the wiring region, a sidewall of at least one of the undercoat, the gate insulating film, and the interlayer film is located between an edge of the flexible substrate and the wiring. The sidewall has a curved portion on a plane in which the wiring is arranged, and a distance between the edge and the curved portion is curvedly varied.

An embodiment of the present invention is a manufacturing method of a display device. The manufacturing method includes: forming a polymer film over a supporting substrate; forming an active region by fabricating a plurality of pixels over the polymer film; forming a display element in each of the plurality of pixels; forming a plurality of wirings and a plurality of terminals over the polymer film to form a wiring region in which the active region is electrically connected to the plurality of terminals through the plurality of wirings; partly removing an insulating film from an edge of the polymer film in the wiring region, the insulating film being included in the active region and extending from the active region; removing the supporting substrate; and cutting the polymer film along a cutting line which extends in a region between the edge and a sidewall of the insulating film formed by partly removing the insulating film. The partial removal of the insulating film is performed so that the sidewall has a curved portion on a plane in which the plurality of wirings is arranged and a distance between the edge and the curved portion is curvedly varied.

An embodiment of the present invention is a manufacturing method of a display device. The manufacturing method includes: forming a polymer film over a supporting substrate; forming an undercoat over the polymer film; forming, over the undercoat, a semiconductor film, a gate, and a gate insulating film sandwiched by the semiconductor film and the gate; forming an interlayer film over the semiconductor film, the gate, and the gate insulating film; forming a source and a drain electrically connected to the semiconductor film; forming a display element over the source and the drain, the display element being electrically connected to one of the source and the drain; forming a wiring and a terminal over the polymer film to form a wiring region in which the display element is electrically connected to the terminal through the wiring; partly removing at least one of the undercoat, the gate insulating film, and the interlayer film from an edge of the polymer film; removing the supporting substrate; and cutting the polymer film along a cutting line which extends in a region between the edge and a sidewall of at least one of the undercoat, the gate insulating film, and the interlayer film, which is formed by the partial removal. The partial removal is performed so that the sidewall has a curved portion on a plane in which the wiring is arranged and a distance between the edge and the curved portion is curvedly varied.

BRIEF DESCRIPTION OF DRAWINGS

FIG. 4 is an enlarged top view of a display device according to an embodiment of the present invention;

FIG. 5 is a schematic cross-sectional view of a display device according to an embodiment of the present invention;

FIG. 7 is an enlarged top view of a display device according to an embodiment of the present invention;

FIG. 8A is a schematic cross-sectional view of a display device according to an embodiment of the present invention, and FIG. 8B and FIG. 8C are conceptual diagrams explaining a shape of a sidewall of an insulating film;

FIG. 11A and FIG. 11B are schematic cross-sectional views explaining a manufacturing method of a display device according to an embodiment of the present invention;

FIG. 12A and FIG. 12B are schematic cross-sectional views explaining a manufacturing method of a display device according to an embodiment of the present invention;

FIG. 13A and FIG. 13B are schematic cross-sectional views explaining a manufacturing method of a display device according to an embodiment of the present invention;

FIG. 15A and FIG. 15B are schematic cross-sectional views explaining a manufacturing method of a display device according to an embodiment of the present invention;

FIG. 16A and FIG. 16B are schematic cross-sectional views explaining a manufacturing method of a display device according to an embodiment of the present invention;

FIG. 25 is a schematic cross-sectional view of a display device according to an embodiment of the present invention;

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present invention, when a plurality of films is formed by processing one film, the plurality of films may have functions or rules different from each other. However, the plurality of films originates from a film formed as the same layer in the same process and has the same layer structure and the same material. Therefore, the plurality of films is defined as films existing in the same layer.

In the specification and the scope of the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

First Embodiment

1. Outline Structure

Figure 1A:
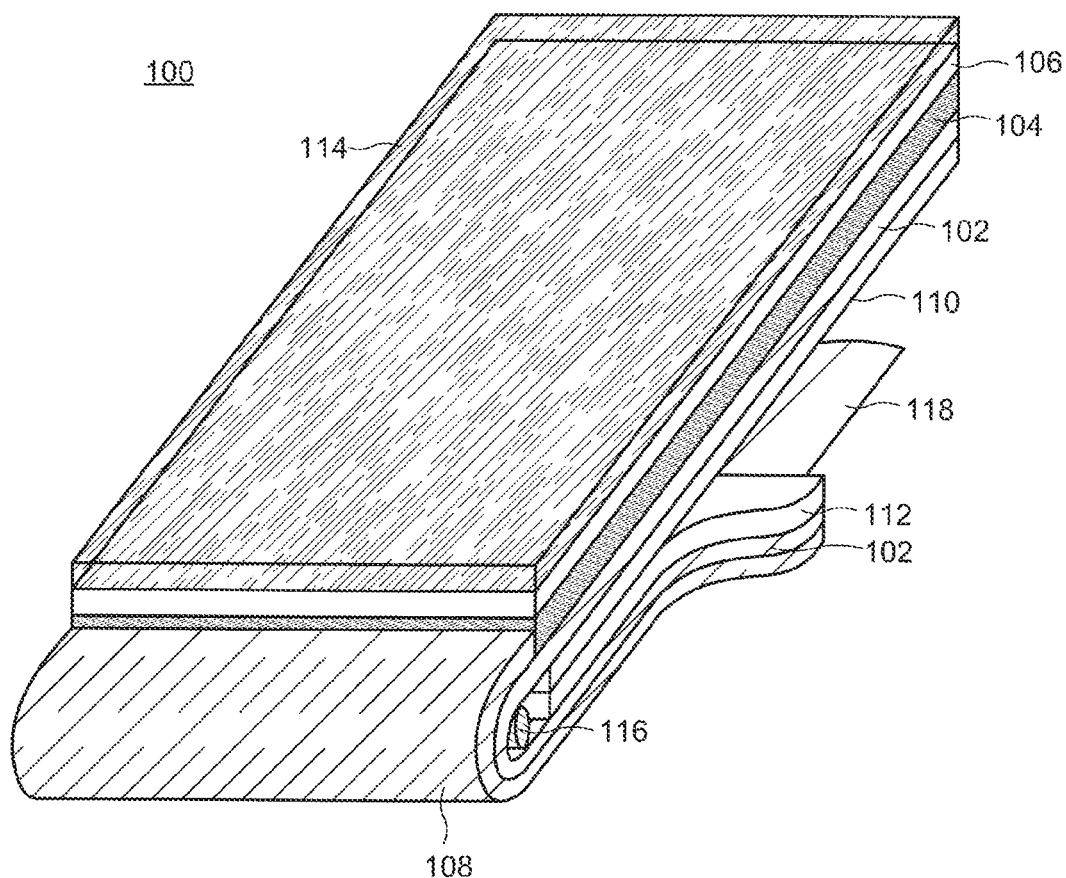
FIG. 1A and FIG. 1B are a schematic perspective view and side view, respectively, of a display device according to an embodiment of the present invention.
Figure 1B:
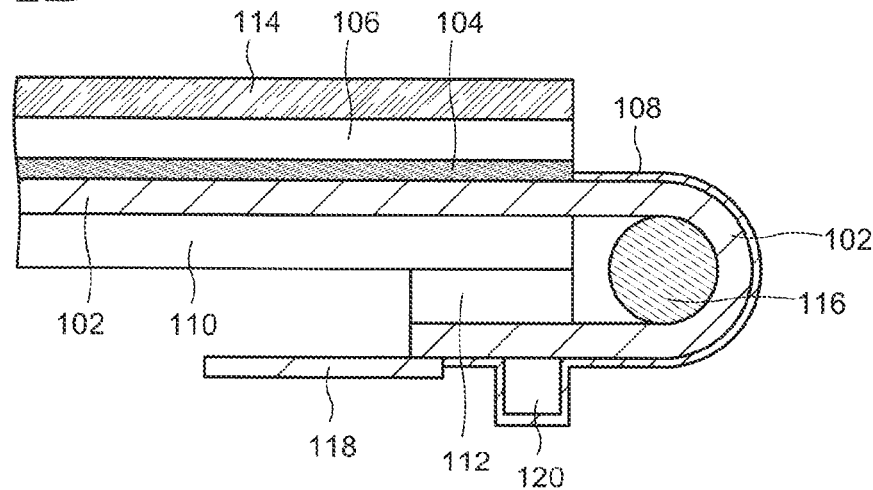

FIG. 1A and FIG. 1B are schematic perspective and side views of a display device 100 according to the present embodiment, respectively. The display device 100 has a flexible substrate 102 and can be bent or folded. An active region 104 is formed over the flexible substrate 102. As described below, a variety of insulating films, conductive films, and semiconductor films are stacked in the active region 104, by which transistors, capacitors, display elements, and the like are fabricated. A cap film 106 is disposed over the active region 104 so that the active region 104 is protected and physical strength is provided to the display device 100 to facilitate handling while maintaining sufficient flexibility. The display device 100 may possess a polarizing plate 114 over the cap film 106 as an optional structure. The active region 104, the cap film 106, and the polarizing plate 114 may have the same or substantially the same shape and overlap with one another. Although not shown, the polarizing plate 114 may serve as the cap film 106 in the display device 100.

A first base film 110 and a second base film 112 are arranged under the flexible substrate 102 to protect the flexible substrate 102 and provide physical strength thereto. The former and the cap film 106 sandwich the active region 104.

Although not shown in FIG. 1A and FIG. 1B, a plurality of wirings 124 for transmitting image signals to the display elements and the like extends from the active region 104 over the flexible substrate 102. The plurality of wirings 124 is electrically connected to a connector 118 such as a FPC (flexible printed circuit) substrate through an IC chip 120. The image signals are input, through the connector 118, to the IC chip 120 from an external circuit which is not illustrated. The image signals are further transmitted to the active region 104 from the IC chip 120, thereby controlling a variety of elements included in the active region 104, such as transistors. The IC chip 120 is an optional structure, and a driver circuit may be formed in the active region 104 instead of the IC chip 120. The IC chip 120 may be formed over the connector 118.

A region of the flexible substrate 102, which does not overlap with the first base film 110 nor the second base film 112, that is, a region between the first base film 110 and the second base film 112 may be covered with a resin layer (or a resin film) 108. The resin layer 108 may be provided so as to cover the IC chip 120 and the connector 118, by which the flexible substrate 102 as well as the wirings 124, the IC chip 120, and the connector 118 formed over the flexible substrate 102 can be protected and physical strength of this region can be controlled.

As shown in FIG. 1A and FIG. 1B, the flexible substrate 102 can be bent or folded in the region between the first base film 110 and the second base film 112. In this case, a bottom surface of the first base film 110 and a bottom surface of the second base film 112 may be in contact with each other directly or through an adhesion layer which is not illustrated. When the flexible substrate 102 is folded, a spacer 116 as an optional structure may be enclosed by the flexible substrate 102. The spacer 116 may have a columnar shape, for example, and can be accommodated in a space surrounded by the flexible substrate 102, the first base film 110, and the second base film 112. Although not shown, the spacer 116 may further have a plate-shaped portion. In this case, the display device 100 may be folded so that the plate-shaped portion is sandwiched by the first base film 110 and the second base film 112. The use of the spacer 116 allows the stereostructure of the display device 100 to be controlled.

Although not shown, the bent or folded region of the flexible substrate 102 is not limited to the region between the first base film 110 and the second base film 112, and the active region 104 may be bent or folded in the display device 100.

Figure 2:
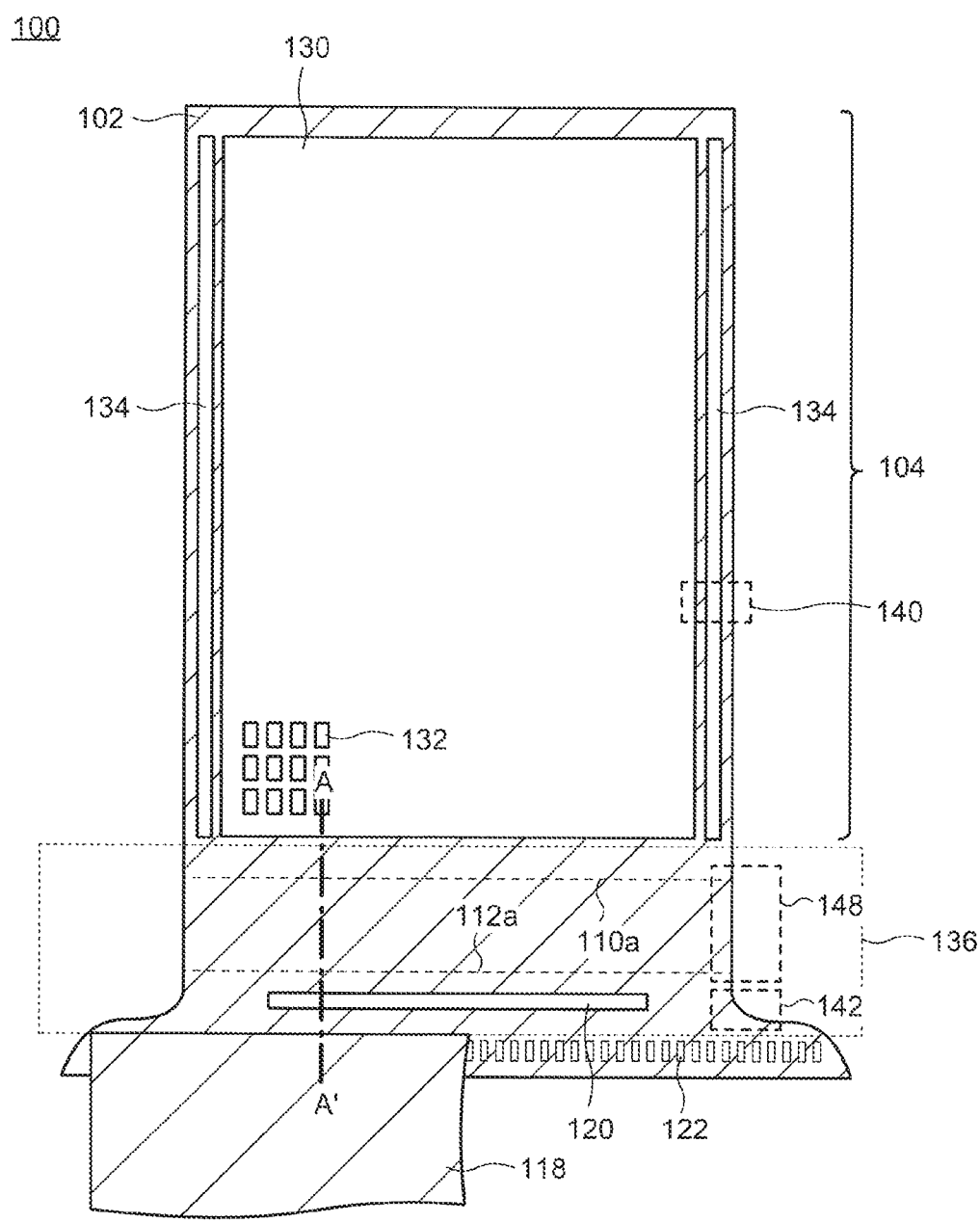
FIG. 2 is a schematic top view of a display device according to an embodiment of the present invention.

FIG. 2 shows a schematic top view of a state where the display device 100 is developed. Here, the polarizing plate 114 and the cap film 106 are not illustrated. As shown in FIG. 2, a plurality of pixels 132, driver circuits 134 for controlling driving of the pixels 132, and the like are fabricated by the variety of elements included in the active region 104. The pixels 132 are each provided with a display element such as a light-emitting element and a liquid crystal element. The plurality of pixels 132 is arranged in a matrix form, and a display region 130 is formed by the plurality of pixels 132. In the specification and claims, the active region 104 includes the display region 130 and the driver circuits 134.

The driver circuits 134 receive a variety of signals supplied from the external circuit and supply them to each pixel 132 to control the variety of elements included in the pixels 132. With this operation, the display elements in the pixels 132 are controlled, and a variety of images are displayed on the display region 130. An example is shown in FIG. 2 in which two driver circuits 134 are provided. However, one driver circuit 134 or three or more driver circuits 134 may be disposed.

Although not illustrated in FIG. 2, the plurality of wirings 124 are disposed so as to extend from the active region 104 to a side surface (lower side in the drawing) of the flexible substrate 102. The wirings 124 are connected to the IC chip 120. The wirings 124 are exposed at their edge portions to form terminals 122. The terminals 122 are used for electrical connection with the connector 118. In the specification and claims, a region of the flexible substrate 102 between the active region 104 and the terminals 122 is called a wiring region 136.

As shown in FIG. 2, a width of the flexible substrate 102 is not constant in the wiring region 136, and the flexible substrate 102 may have a shape so that a width of the wiring region 136 closer to the terminals 122 than the active region 104 is larger than that closer to the active region 104 than the terminals 122. In this case, the width of the flexible substrate 102 may be changed continuously. Alternatively, the flexible substrate 102 may have a width which is the same as that of the active region 104 in the whole wiring region 136.

Figure 3:
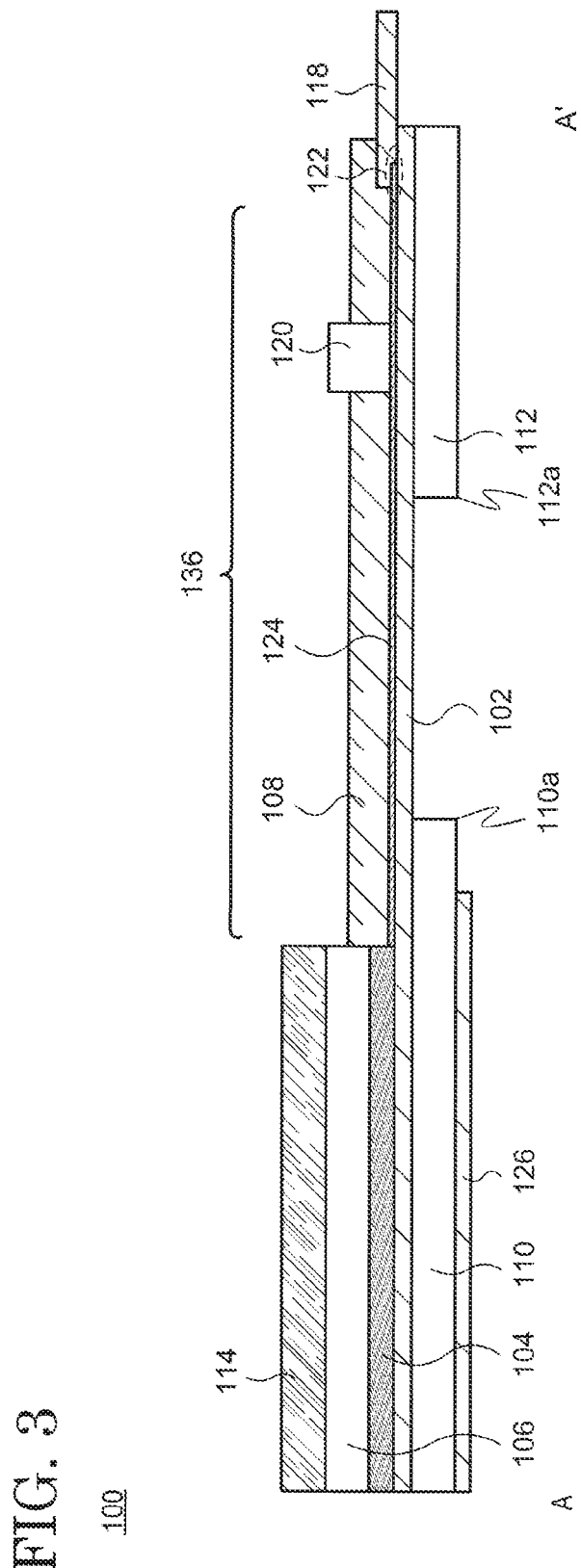
FIG. 3 is a schematic side view of a display device according to an embodiment of the present invention.

A schematic cross-sectional view along a chain line A-A' of FIG. 2 is shown in FIG. 3. In the state where the display device 100 is developed, the first base film 110 and the second base film 112 are spaced from each other, and edges 110a and 112a thereof face each other as shown in FIG. 3. A part of the first base film 110 may overlap with the wiring region 136. The second base film 112 may be arranged so as to overlap with the IC chip 120 and the connector 118. A back surface of the flexible substrate 102 may be exposed between the first base film 110 and the second base film 112. Note that a thermal diffusion plate 126 may be disposed, as an optional structure, under the first base film 110 or between the flexible substrate 102 and the first base film 110 so as to overlap with the active region 104. The thermal diffusion plate 126 has a function to diffuse heat generated in the active region 104 to the exterior, includes a metal or an alloy such as aluminum, copper, and stainless steel, and may have a thickness providing flexibility.

The wirings 124 are arranged over the flexible substrate 102 and extend from the active region 104 to the terminals 122 through the wiring region 136. The aforementioned resin layer 108 may be disposed over the wirings 124. Although not illustrated in FIG. 3, the resin layer 108 may be arranged so as to cover a part of an upper surface of the IC chip 120 or whole of the IC chip 120. Alternatively, the resin layer 108 may be provided so as not to cover an upper surface of the connector 118.

2. Active Region

A top view of the region 140 in FIG. 2 is shown in FIG. 4, and a schematic cross-sectional view along a chain line B-B' of FIG. 4 is shown in FIG. 5. As shown in FIG. 4, the driver circuit 134 is arranged between the pixel 132 which is adjacent to an edge 102a of the flexible substrate 102 or which is closest to the edge 102a and the edge 102a. For visibility, the explanation of FIG. 5 is provided for a case where the pixel 132 possesses one transistor 150 and the light-emitting element 160 on the chain line B-B' and where one transistor 152 and two wirings 154 and 156 intersect the chain line B-B' in the driver circuit 134. Although the explanation is given using an example in which a light-emitting element is used as the display element 160, the structure of the display device 160 is not limited. For example, the display element 160 may be a voltage-driving type display element such as a liquid crystal element and an electrophoresis element.

The transistor 150 may function as an element for controlling the display element 160. The transistor 152 may be included in a circuit such as a buffer circuit, a shift register, and a latch circuit. The function of the wirings 154 and 156 is also not limited, and the wirings 154 and 156 may function as wirings connecting the variety of circuits provided in the driver circuit 134. Alternatively, the wirings 154 and 156 may function as a power-source line to supply a constant potential to one of the electrodes of the display element 160. The following explanation is given for a case where the wiring 156 is one of the wirings in the driver circuit 134 and is adjacent to or closest to the edge 102a.

As illustrated in FIG. 5, a variety of insulating films, conductive films, and semiconductor films are stacked in the display region 130 as well as in the pixel 132 and the driver circuit 134 constructing the display region 130. For example, an undercoat 200 may be formed over the flexible substrate 102. The undercoat 200 has a function to prevent diffusion of impurities such as an alkaline metal ion included in the flexible substrate 102 to the transistor 150 and 152 and may include an inorganic compound containing silicon. As an inorganic compound, silicon oxide, silicon nitride, silicon oxynitride, silicon nitride oxide, and the like are represented. The undercoat 200 may have a single-layer structure or a structure in which a plurality of layers including the compounds selected from the aforementioned inorganic compounds is stacked.

Semiconductor films 202 forming active regions of the transistors 150 and 152, gates 206, and a gate insulating film 204 sandwiched between the semiconductor films 202 and the gates 206 are provided over the undercoat 200. The semiconductor films 202 may include a Group 14 element such as silicon or an oxide semiconductor, for example.

The gate insulating film 204 is an insulating film and may include an inorganic compound containing silicon. The gate insulating film 204 may also have a single-layer structure or a stacked-layer structure.

The gates 206 have a function to generate carriers in the semiconductor films 202 when being applied with a voltage, by which on/off of the transistors 150 and 152 is controlled. The gates 206 may be formed by using a metal such as titanium, aluminum, copper, molybdenum, tungsten, and tantalum or an alloy thereof to have a single-layer or stacked layer structure. For example, a structure may be employed in which a metal with high conductivity, such as aluminum and copper, is sandwiched by a metal with a relatively high melting point, such as titanium, tungsten, and molybdenum.

An interlayer film 208 may be disposed over the gates 206.

The interlayer film 208 is also an insulating film and may include an inorganic compound containing silicon similar to the gate insulating film 204. The interlayer film 208 may also have a single-layer structure or a stacked-layer structure.

Each of the transistors 150 and 152 further possesses a source 210 and a drain 212. The sources 210 and the drains 212 are electrically connected to the semiconductor films 202 in opening portions formed in the gate insulating film 204 and the interlayer film 208. The sources 210 and the drains 210 may also contain a metal usable in the gates 206 and are formed as a stacked-layer structure or a single-layer structure. Note that, the wirings 154 and 156 may be simultaneously formed with the sources 210 and the drains 212. In this case, the sources 210, the drains 212, and the wirings 154 and 156 can exist in the same layer.

The transistors 150 and 150 are structured by the aforementioned semiconductor films 202, the gate insulating film 204, the gates 206, the interlayer film 208, the sources 210, the drains 201, and the like. The structure of the transistors 150 and 152 is not limited, and they may have a top-gate structure shown in FIG. 5 or a bottom-gate structure. Alternatively, the gates 206 may be arranged over and under the semiconductor films 202. Alternatively, a transistor having a so-called multi-gate structure in which the plurality of gates 206 overlaps with one semiconductor film 202 may be used.

The display device 100 may further possess a leveling film 214 over the transistors 150 and 152. The leveling film 214 has a function to absorb depressions, projections, and inclinations caused by the transistors 150 and 152 and the like and to provide a flat surface. The leveling film 214 is also an insulating film and may by formed with an organic compound. As an organic compound, a polymer material such as an epoxy resin, an acrylic resin, a polyimide, a polyamide, a polyester, a polycarbonate, and a polysiloxane is represented. Although not shown, an insulating film including an inorganic compound such as silicon nitride, silicon nitride oxide, silicon oxynitride, or silicon oxide may be formed over the leveling film 214.

An opening portion is formed in the leveling film 214 to electrically connect the transistor 150 to the display element 160. As shown in FIG. 5, a connection electrode 216 may be provided in the opening portion. The connection electrode 216 may be formed by using a conductive oxide capable of transmitting visible light, such as indium-tin oxide (ITO) and indium-zinc oxide (IZO), for example.

The display device 100 may have a supplementary capacitor electrode 220 over the leveling film 214 as an optional structure. Note that the wirings 154 and 156 may be formed simultaneously with the supplementary capacitor electrode 220. In this case, these electrodes and wirings can exist in the same layer.

In the example shown in FIG. 5, a part of the leveling film 214 is removed so that the interlayer film 208 is exposed in the driver circuit 134, and the wirings 154 and 156 are arranged so as to be in contact with the exposed interlayer film 208. The use of such a structure allows the leveling film 214 to be arranged in a position spaced from the edge 102a of the flexible substrate 102. As described above, the leveling film 214 may include an organic compound. An organic compound generally has a higher hydrophilicity compared with an inorganic compound containing silicon. Therefore, when the leveling film 214 is in contact with the outside of the display device 100 at the edge 102a, impurities such as water enter the leveling film 214 from outside and diffuse into the driver circuit 134 and the display region 130 via the leveling film 214. That is, the leveling film 214 serves as a transporting pathway for the impurities. As a result, deterioration of the display device 100 caused by the impurities occurs.

However, it is possible to significantly reduce the probability of the entrance of impurities by arranging the leveling film 214 so as not to be in contact with the edge 102a as shown in FIG. 5, by which reliability of the display device 100 can be improved.

An insulating film 222 is disposed so as to cover the supplementary capacitor electrode 220, the wiring 156, and a part of the wiring 154. The insulating film 222 is sandwiched by the supplementary capacitor electrode 220 and a first electrode 230 of the display element 160 formed thereover to form a supplementary capacitor. That is, the insulating film 222 functions as a dielectric film. This supplementary capacitor may be electrically connected to the gate 206 of the transistor 150 to contribute to maintenance of a potential between the source 210 and the gate 206 of the transistor 150. Simultaneously, the insulating film 222 further functions as a protection film of the wiring 156. Similar to the undercoat 200 and the gate insulating film 204, the insulating film 222 may include an inorganic compound containing silicon and may be formed to have a single-layer structure or a stacked-layer structure.

The display device 100 possesses, over the insulating film 222, the first electrode 230 overlapping with the supplementary capacitor electrode 220 and electrically connected to the connection electrode 216. Depressions and projections caused by the first electrode 230 and the opening portion formed in the leveling film 214 are covered by a partition wall 224 covering an edge portion of the first electrode 230. The partition wall 224 is able to prevent disconnection of an EL layer 232 and a second electrode 240 formed thereover by covering the edge portion of the first electrode 230. The partition wall 224 is also an insulating film and may include a polymer material such as an epoxy resin, an acrylic resin, a polyimide, a polyamide, a polyester, a polycarbonate, and a polysiloxane.

The display element 160 possesses the EL layer 232 and the second electrode 240 in addition to the first electrode 230. The EL layer 232 and the second electrode 240 are provided to overlap with the first electrode 230 and the partition wall 224.

The display device 100 may further have a sealing film (passivation film) 250 over the display element 160. The passivation film 250 has a function to prevent the entrance of impurities (water, oxygen, and the like) from the exterior to the display element 160 and the transistors 150 and 152. As shown in FIG. 5, the passivation film 250 may include three layers (first layer 252, second layer 254, and third layer 256). An inorganic compound containing silicon can be used for the first layer 252 and the third layer 256. An organic compound may be used for the second layer 254. The second layer 254 may be formed so as to absorb depressions and projections caused by the display element 160 and the partition wall 224 and to provide a flat surface.

The cap film 106 is fixed over the flexible substrate 102 through an adhesion layer 260. A polyester such as poly (ethylene terephthalate) and poly(ethylene naphthalate), a polycarbonate, a polymer material having a polyolefin as a main skeleton may be used for the cap film 106. Note that a material the same as that of the cap film 106 can be used for the first base film 110 and the second base film 112. When the cap film 106 has adhesion, it is not necessary to provide the adhesion layer 260.

The display device 100 may further possess the polarizing plate 114 over the cap film 106 as an optional structure. The polarizing palate 114 may be a circularly polarizing plate or a linearly polarizing plate. When the polarizing palate 114 is a circularly polarizing plate, light entering from the exterior and reflected by the first electrode 230, the wirings 154 and 156, and the like can be confined within the display device 100, by which an image with high contrast can be produced. Note that the display device 100 may be configured so that the cap film 106 is not disposed and the polarizing plate 114 is in contact with the passivation film 250 or the adhesion layer 260.

3. Structure of Edge Portion of Substrate

As described above, a number of insulating films is included in the active region 104 of the display device 100, and at least one of the aforementioned insulating films capable of including an inorganic compound (e.g., the undercoat 200, the gate insulating film 204, the interlayer film 208, the insulating film 222, and the first layer 252 and the third layer 256 of the passivation film 250) and the insulating films capable of including an organic compound (e.g., the leveling film 214, the partition wall 224, the second layer 254 of the passivation film 250, and the like) may be partly removed from the edge 102a of the flexible substrate 102. Specifically, as shown in FIG. 4 and FIG. 5, at least one of the aforementioned insulating films is partly removed between the display region 130 and the edge 102a or between the driver circuit 134 and the edge 102a. In the example shown in FIG. 5, the edge portions of the undercoat 200, the gate insulating film 204, the interlayer film 208, the insulating film 222, the first layer 252, and the third layer 256 do not each overlap with the edge 102a and are located inside the flexible substrate 102 from the edge 102a. That is, the sidewalls of these films are located between the edge 102a and the driver circuit 134. In other words, the sidewalls of these films are located in the driver circuit 134 or between one of the wirings (e.g., wiring 156) extending from the driver circuit 134, which is adjacent to the edge 102a, and the edge 102a. When the driver circuit 134 is not provided in the active region 104, the sidewalls of these films are located between one of the wirings extending from the display region 130, which is closest to the edge 102a, and the edge 102a. In a region 270 between the sidewalls and the edge 102a, the adhesion layer 260 is in direct contact with the sidewalls of the insulating films. When the adhesion layer 260 is not employed, the cap film 106 is in contact with the flexible substrate 102 and the sidewalls of the insulating films.

Figure 6A:
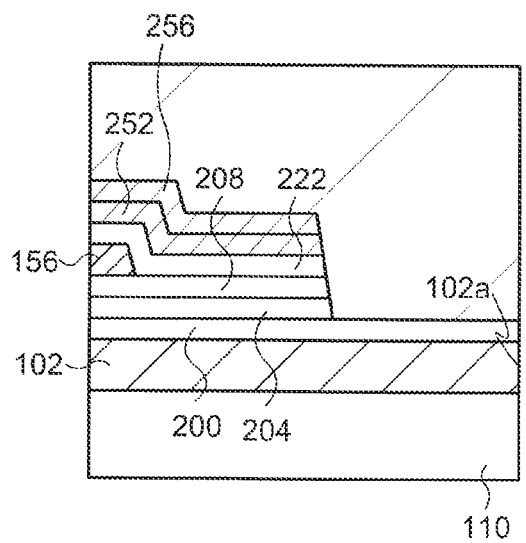
FIG. 6A to FIG. 6D are schematic cross-sectional views of a display device according to an embodiment of the present invention.

In FIG. 5, an example is shown in which all of the insulating films including the undercoat 200, the gate insulating film 204, the interlayer film 208, the insulating film 222, and the first layer 252 and the third layer 256 of the passivation film 250 are spaced from the edge 102a. However, the display device 100 is not limited to such a configuration. For example, as shown in FIG. 6A, the display device 100 may be configured so that the edge portion of the undercoat 200 overlaps with the edge 102a, but the edge portions of other insulating films do not overlap with the edge 102a. In this case, the sidewalls of the gate insulating film 204, the interlayer film 208, the insulating film 222, and the first layer 252 and the third layer 256 of the passivation film 250 are located between the wiring 156 and the edge 102a.

Figure 6B:
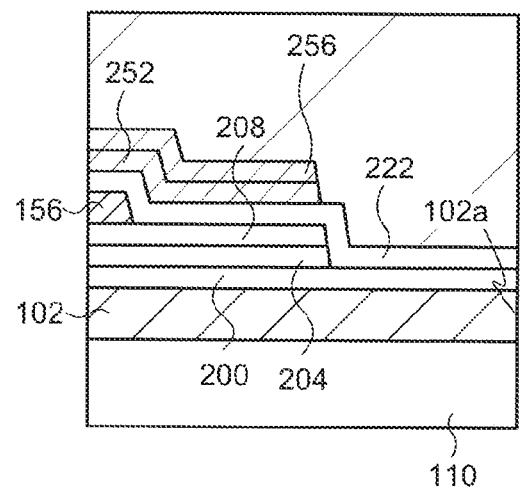

Alternatively, as shown in FIG. 6B, the display device 100 may be configured so that the edge portions of the undercoat 200 and the insulating film 222 overlap with the edge 102a, but the edge portions of other insulating films do not overlap with the edge 102a. In this case, the sidewalls of the gate insulating film 204, the interlayer film 208, and the first layer 252 and the third layer 256 of the passivation film 250 are located between the wiring 156 and the edge 102a.

Figure 6C:
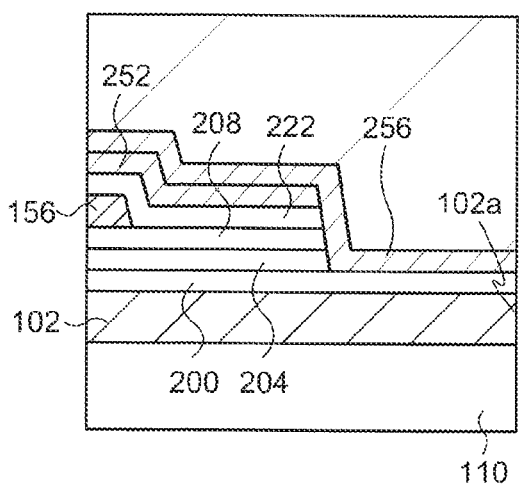

Alternatively, as shown in FIG. 6C, the display device 100 may be configured so that the edge portions of the undercoat 200 and the third layer 256 of the passivation film 250 overlap with the edge 102a, but the edge portions of other insulating films do not overlap with the edge 102a. In this case, the sidewalls of the gate insulating film 204, the interlayer film 208, the insulating film 222, and the first layer 252 of the passivation film 250 are located between the wiring 156 and the edge 102a.

Figure 6D:
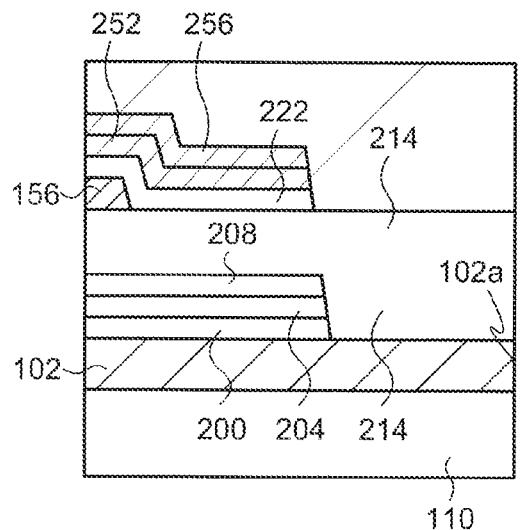

Alternatively, as shown in FIG. 6D, the display device 100 may be configured so that the edge portions of the insulating films capable of including an organic compound (e.g., leveling film 214) overlap with the edge 102a, but the edge portions of other insulating films do not overlap with the edge 102a. In this case, the sidewalls of the undercoat 200, the gate insulating film 204, the interlayer film 208, and the first layer 252 and the third layer 256 of the passivation film 250 are located between the wiring 156 and the edge 102a. In this case, the leveling film 214 is removed in a part of the region where the driving circuit 134 is provided. This is because, if the leveling film is not divided in any region, water and oxygen reach the display element 160 to degrade the performance thereof since water and oxygen readily permeate the leveling film 214 formed with an organic film.

As shown in FIG. 4, a width of the region 270 may be constant or substantially constant in the active region 104. That is, the display device 100 may be configured so that a distance (namely, the width of the region 270) between the edge 102a and the sidewalls of the partly removed insulating films is constant or substantially constant.

The configuration in which all of or a part of the insulating films are partly removed from the edge 102a of the flexible substrate 102 can be applied to the wiring region 136. An enlarged figure of a partial region 142 (see FIG. 2) of the wiring region 136 is schematically shown in FIG. 7. Here, the edge 102a of the flexible substrate 102 and the wirings 124 located in a vicinity of the edge 102a and extending from the active region 104 are illustrated. In the region 142, the edge 102a has a curved portion. The region 270 has a shape depressed inside the flexible substrate 102 on a plane in which the wirings 124 are formed so as to surround the curved portion. Namely, all of or a part of the insulating films are scooped and have a cutoff 272. Hence, a distance L between the edge 102a and the sidewalls of the partly removed insulating films is not constant and varies in a portion where the edge 102a is curved.

A more specific explanation is provided by using FIG. 7, FIG. 8A, and FIG. 8B. FIG. 8A is a schematic cross-sectional view along a chain line C-C' of FIG. 7. As shown in FIG. 7 and FIG. 8A, the sidewalls are curved on a plane in which the wirings 124 are formed to provide a curved portion so as to match the curve of the edge 102a, resulting in the cutoff 272 in all of or a part of the insulating films. Accordingly, the cutoff 272 has a shape so that the distance L between the edge 102a and the curved portion smoothly (or gradually) varies as shown in FIG. 7. Typically, the cutoff 272 has a shape having a curve expressed by a part of a circle or an ellipse. Here, the distance L is a length of a normal line 144 of the edge 102a from the edge 102a to the sidewalls of the insulating films. For example, the distance L varies so that a plot of the distance L against a position y on the edge 102a is expressed by a curve (see FIG. 8B). Here, the position y is a position of a point on the edge 102a. The plot has segments in which the distance L is constant and a segment which is sandwiched by these segments and in which the distance L increases and decreases continuously or curvedly. In the segment in which the distance L increases and decreases continuously or curvedly, the slope (derivative) of the plot continuously varies. Alternatively, as shown in FIG. 8C, the slope (derivative) of the plot may continuously vary between the segment in which the distance L is constant and the segment in which the distance L continuously increases and decreases.

Figure 9:
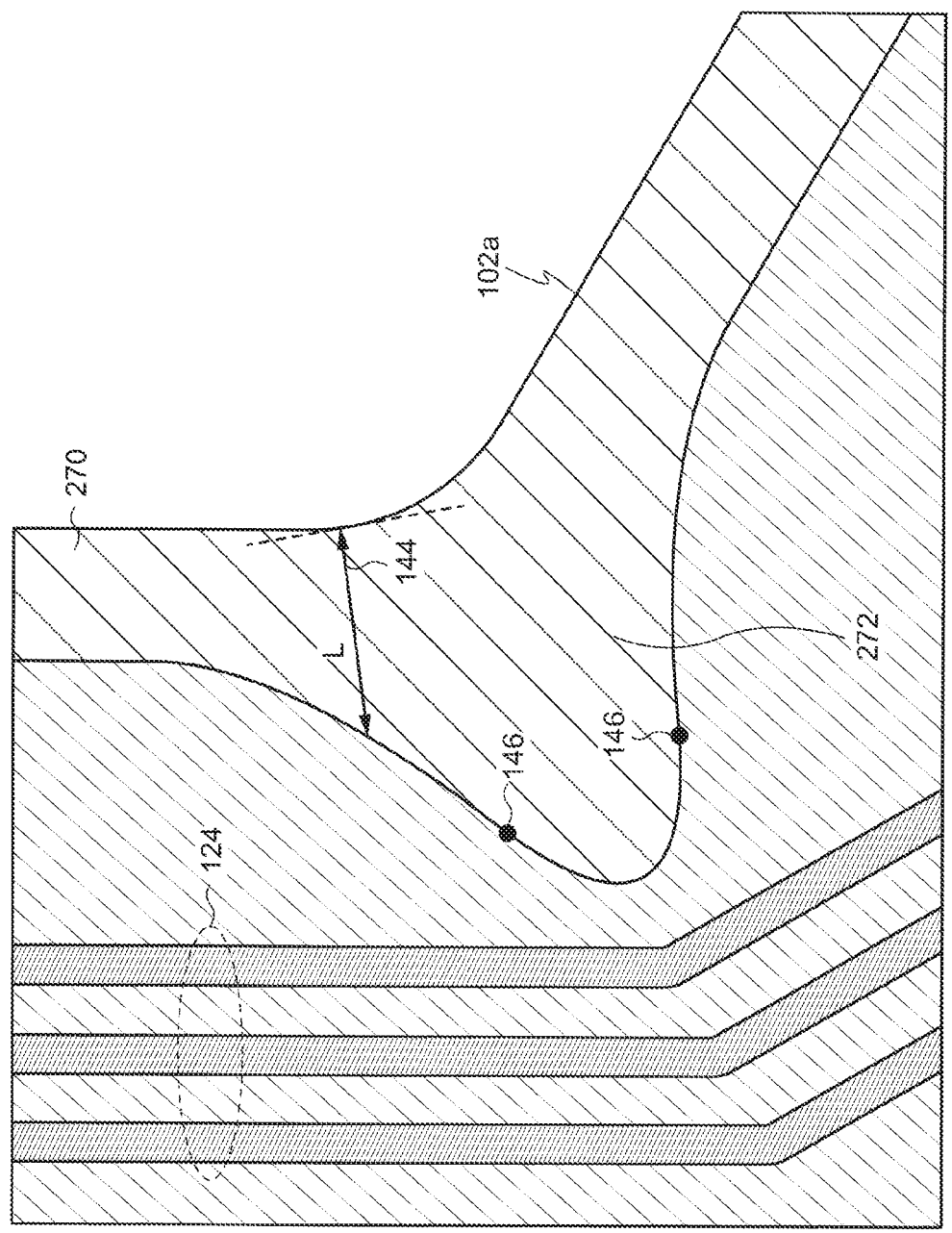
FIG. 9 is an enlarged top view of a display device according to an embodiment of the present invention.

In FIG. 7, the insulating films are partly removed so that the sidewalls of the insulating films form a part of a circumference on a plane in which the wirings 124 are formed. However, the structure of the edge portions of the insulating films is not limited to such a structure. For example, as shown in FIG. 9, the insulating films may be configured so that the sidewalls of the insulating films have a plurality of inflection points 146 in a plane on which the wirings 124 are formed. In this case, the insulating films have the cutoff 272, and the slope of the plot of the distance L against the position y continuously varies from the segment in which the distance L is constant.

Although described in detail in the Second Embodiment, it is possible to significantly reduce the probability that a crack is generated in the flexible substrate 102 and the insulating films during manufacture of the display device 100 by partly removing one or both of the insulating films including an inorganic compound and the insulating films including an organic compound from the edge 102a of the flexible substrate 102. Particularly, generation of cracks can be effectively inhibited in the region where the edge 102a is curved as shown in FIG. 7 and FIG. 9. As a result, not only the manufacturing yield of a display device can be improved, but also a display device with high reliability can be produced.

Second Embodiment

In the present embodiment, a manufacturing method of the display device 100 described in the First Embodiment is described. An explanation of the structures the same as those of the First Embodiment may be omitted.

Figure 10:
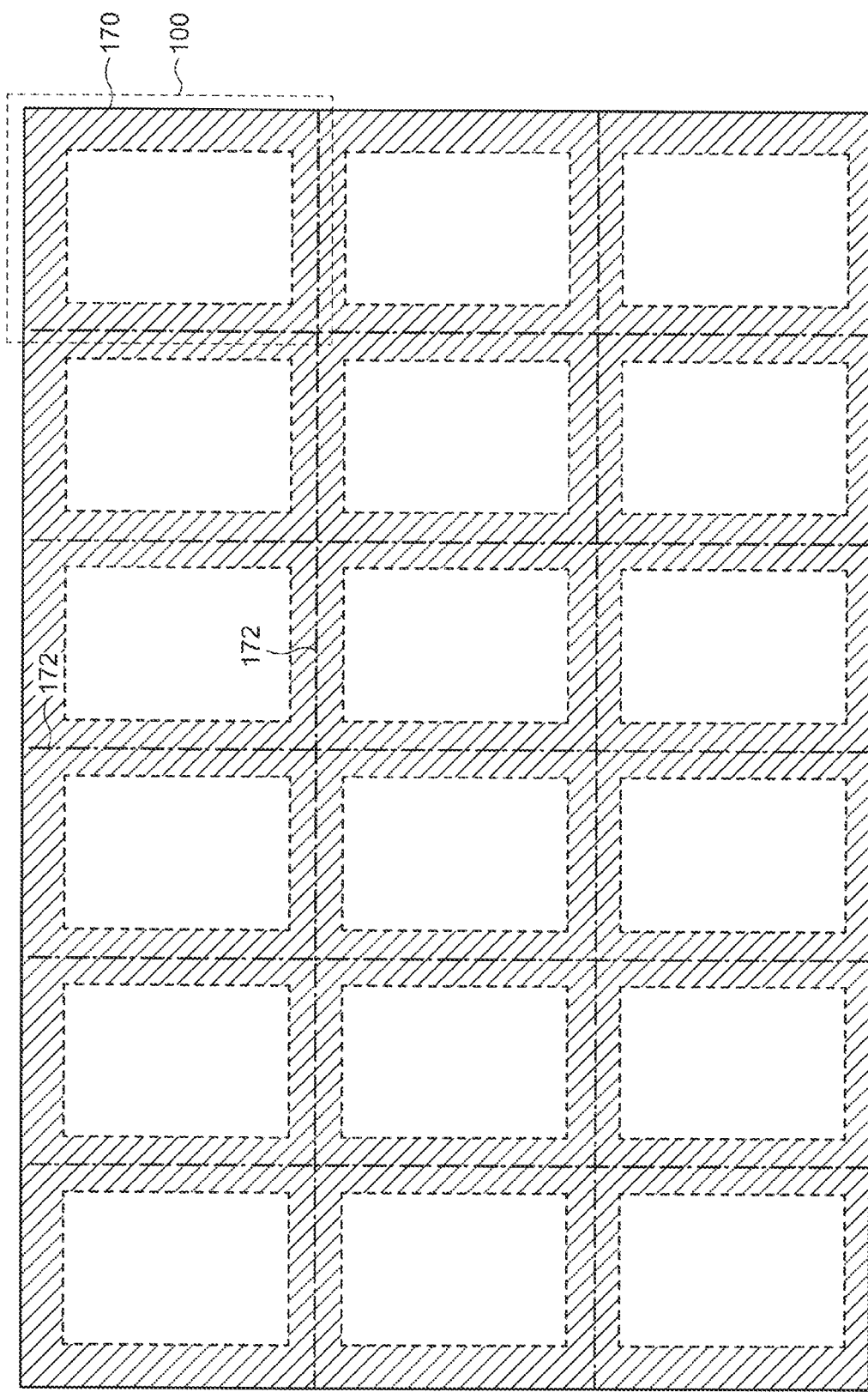
FIG. 10 is a schematic top view explaining a manufacturing method of a display device according to an embodiment of the present invention.

The display device 100 is manufactured by fabricating a plurality of display devices 100 over a supporting substrate generally called mother glass, followed by dividing the supporting substrate into the individual display devices 100. For example, the plurality of display devices 100 is prepared in a matrix form over the mother glass 170 as shown in FIG. 10. Here, a mode is illustrated where a total of eighteen display devices 100 arranged in three rows and six columns are fabricated over one mother glass 170. The number of the display devices 100 fabricated over one mother glass 170 is not limited and may be determined in view of the size and shape of the mother glass 170 and the display devices 100. Hereinafter, a manufacturing method of the display device 100 is explained by mainly using the cross-sectional views corresponding to the cross-sectional structure shown in FIG. 5.

First, the flexible substrate 102 is formed over the mother glass 170 as shown in FIG. 11A. The flexible substrate 102 is an insulating film and may include a material selected from polymer materials exemplified by a polyimide, a polyamide, a polyester, and a polycarbonate. When the flexible substrate 102 is positioned over the mother glass 170, the flexible substrate 102 can be regarded as a polymer film fixed over the mother glass 170 because the mother glass 170 does not have flexibility. The flexible substrate 102 can be formed by applying a wet-type film-formation method such as a printing method, an ink-jet method, a spin-coating method, and a dip-coating method or a lamination method, for example.

The undercoat 200 is prepared over the flexible substrate 102 (FIG. 11A). The undercoat 200 may include a material described in the First Embodiment and may be formed by applying a chemical vapor deposition method (CVD method), a sputtering method, or the like so as to have a single-layer or stacked-layer structure. When an impurity concentration in the flexible substrate 102 is low, the undercoat 200 may not be provided or may be formed to cover only a part of the flexible substrate 102.

Next, the semiconductor films 202 are formed (FIG. 11B). When the semiconductor films 202 contain silicon, the semiconductor films 202 may be formed by using silane gas as a raw material with a CVD method. Crystallization may be carried out by performing a heating treatment or applying light such as a laser on the obtained amorphous silicon. When the semiconductor films 202 contain an oxide semiconductor, the semiconductor films 202 can be formed with a target including an oxide semiconductor by utilizing a sputtering method.

Next, the gate insulating film 204 is prepared so as to cover the semiconductor films 202 (FIG. 11B). The gate insulating film 204 can be formed by applying a CVD method or a sputtering method. Next, the gates 206 are formed over the gate insulating film 204 with a sputtering method or a CVD method (FIG. 11B). Although a detailed explanation is omitted, doping may be appropriately conducted on the semiconductor films 202 after forming the semiconductor films 202 to form source/drain regions 202b, channel regions 202a, and low-concentration impurity regions 202c (FIG. 11B).

Next, the interlayer film 208 is formed over the gates 206 (FIG. 12A). Similar to the undercoat 200 and the gate insulating film 204, the interlayer film 208 may be formed by applying a CVD method or a sputtering method. Next, etching is performed on the interlayer film 208 and the gate insulating film 204 to prepare the openings reaching the semiconductor films 202 (FIG. 12B). The openings can be formed by plasma etching in a gas including a fluorine-containing hydrocarbon, for example.

Next, a metal film is formed to cover the openings and processed with etching to give the sources 210 and the drains 212 (FIG. 13A), by which the transistors 150 and 152 are fabricated. Although not shown in the present embodiment, the terminals 122 and the wirings 124 may be simultaneously formed with the sources 210 and the drains 212.

Next, the leveling film 214 is formed over the whole of the mother glass 170 so as to cover the transistors 150 and 152 (FIG. 13A). The leveling film 214 may include the polymer material described in the First Embodiment and may be prepared by applying a spin-coating method, an ink-jet method, a printing method, a dip-coating method, or the like. After that, etching is conducted on the leveling film 214 to form the opening portions reaching the sources 210. Additionally, etching is performed on the leveling film 214 so that the edge portion of the leveling film 214 does not overlap with the edge 102a (FIG. 13B). That is, a part of the leveling film 214 is removed from the edge 102a to expose the interlayer film 208. The formation of the opening portions and the exposure of the interlayer film 208 may be conducted in the same etching step or different etching steps. Note that the structure where the interlayer film 208 is exposed is called a water-blocking structure.

Figure 14A:
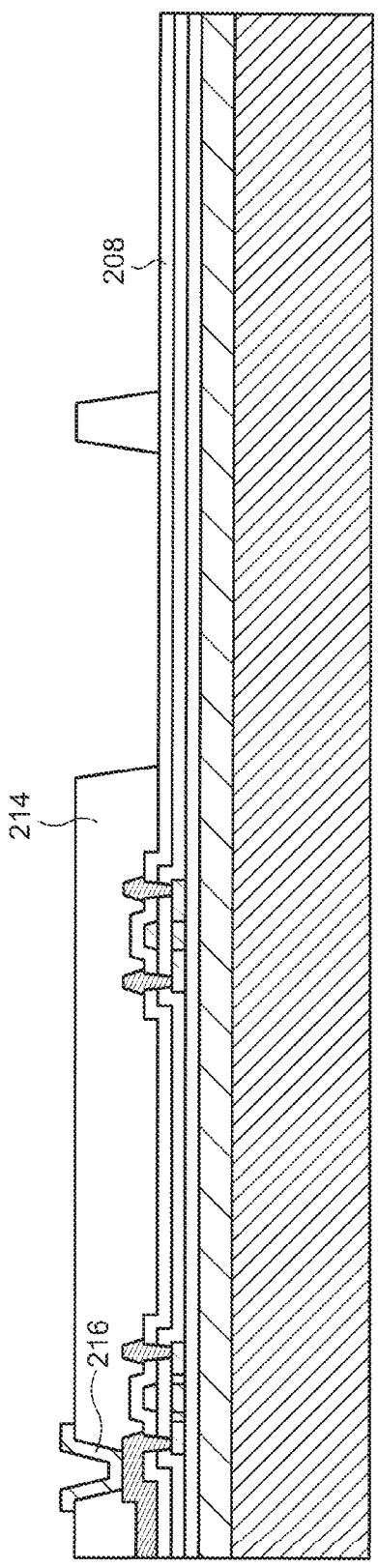
FIG. 14A and FIG. 14B are schematic cross-sectional views explaining a manufacturing method of a display device according to an embodiment of the present invention.

Next, the connection electrode 216 is formed so as to cover the opening portions exposing the sources 210 (FIG. 14A). For example, the connection electrode 216 can be formed by sputtering a conductive oxide. Although not shown, the terminals 122 may be simultaneously covered with a conductive oxide when the connection electrode 216 is formed. It is not always necessary to form the connection electrode 216. However, the formation of the connection electrode 216 prevents oxidation or deterioration of the sources 210 and the terminals 122 in the following processes, by which an increase in contact resistance at their surfaces can be prevented.

Figure 14B:
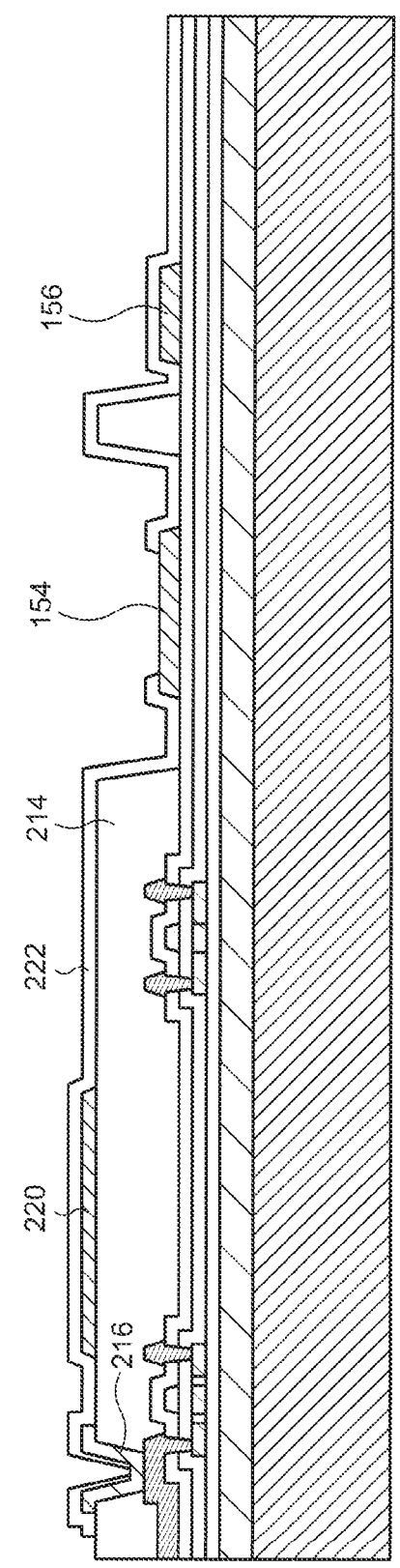

Next, the supplementary capacitor electrode 220 is formed over the leveling film 214 (FIG. 14B). The supplementary capacitor electrode 220 may include a metal or an alloy usable in the gates 206, the sources 210, and the drains 212 and may be formed by applying a sputtering method or a CVD method. The supplementary capacitor electrode 220 may have a single-layer structure or a stacked-layer structure. As shown in FIG. 14B, the wirings 154 and 156 are simultaneously formed over the interlayer film 208 when the supplementary capacitor electrode 220 is formed in the present embodiment. However, as described above, the wirings 154 and 156 may be simultaneously formed when the sources 210 and the drains 212 are formed.

After that, the insulating film 222 is formed so as to cover the supplementary capacitor electrode 220 (FIG. 14B). The insulating film 222 may include an inorganic compound such as silicon nitride, silicon nitride oxide, silicon oxynitride, and silicon oxide and may be formed by applying a CVD method or a sputtering method. Note that the insulating film 222 possesses an opening exposing a part of a surface of the connection electrode 216. In this opening, the first electrode 230 of the display element 160 is electrically connected to the connection electrode 216. The insulating film 222 is formed so as to cover all of or a part of the wirings 154 and 156.

Next, as shown in FIG. 15A, the insulating films located in the active region 104 and extending from the active region 104 to the wiring region 136 are partly removed from the edge 102a to form the region 270. Here, etching is simultaneously performed on the undercoat 200, the gate insulating film 204, the interlayer film 208, and the insulating film 222 so that the aforementioned insulating films located between the edge 102a and the wiring 156 are partly removed to expose the flexible substrate 102. Hence, the sidewalls of these insulating films exist in the same plane and exist between the edge 102a and the wiring 156, that is, between the edge 102a and the driving circuit 134 or between the edge 102a and the display region 130. Although not illustrated, the cutoff 272 is formed in the curved portion of the edge 102a in this step (see FIG. 7).

In the present embodiment, an example is described in which the undercoat 200, the gate insulating film 204, the interlayer film 208, and the insulating film 222 are simultaneously etched to form the region 270. However, the formation and etching of each insulating film may be carried out stepwise. For example, the undercoat 200 may be formed and then partly removed from the edge 102a, which may be followed by the formation of the gate insulating film 204. In this case, partial removal of the gate insulating film 204, formation of the interlayer film 208, partial removal of the interlayer film 208, formation of the insulating film 222, partial removal of the insulating film 222 are sequentially performed.

Next, the first electrode 230 is formed so as to be in contact with the connection electrode 216 and cover the supplementary capacitor electrode 220. When the light emission from the display element 160 is extracted through the second electrode 240, the first electrode 230 is configured to reflect visible light. In this case, a metal with a high reflectance, such as silver and aluminum, or an alloy thereof is used for the first electrode 230. Alternatively, a film of a conductive oxide having a light-transmitting property is formed over a film including the metal or alloy. When the light emission from the display element 160 is extracted through the first electrode 230, the first electrode 230 may be formed with a conductive oxide having a light-transmitting property.

Next, the partition wall 224 is formed so as to cover the edge portion of the first electrode 230 (FIG. 16A). Steps caused by the first electrode 230 and the like are absorbed and the first electrodes 230 of the adjacent pixels 132 are electrically insulated by the partition wall 224. The partition wall 224 can be formed by using a polymer material such as an epoxy resin and an acrylic resin with a wet-type film-formation method.

Next, the EL layer 232 and the second electrode 240 of the display element 160 are formed so as to cover the first electrode 230 and the partition wall 224 (FIG. 16B). The EL layer 232 includes an organic compound and may be formed by applying a wet-type film-formation method or a dry-type film-formation method such as evaporation. The structure of the EL layer 232 is arbitrarily determined, and the EL layer 232 can be structured with a plurality of layers with different functions. For example, the EL layer 232 may be formed by appropriately combining a carrier-injection layer, a carrier-transporting layer, an emission layer, a carrier-blocking layer, and the like. The EL layer 232 may have different structures between the adjacent pixels 132. An example is shown in FIG. 16B in which the EL layer 232 includes a hole injection/transporting layer 234, an emission layer 236, and an electron injection/transporting layer 238.

When the light-emission from the display element 160 is extracted through the first electrode 230, a metal such as aluminum, magnesium, and silver or an alloy thereof can be used for the second electrode 240. On the other hand, when the light-emission from the display element 160 is extracted through the second electrode 240, a conductive oxide or the like with a light-transmitting property, such as ITO, may be used for the second electrode 204. Alternatively, a film of the metal may be formed at a thickness which allows visible light to pass therethrough. In this case, a conductive oxide having a light-transmitting property may be further stacked. Note that, the second electrode 240 may be formed so as to be connected to the wiring 154. When a resistance of the second electrode 240 is relatively high, the wiring 154 functions as an auxiliary wiring, thereby suppressing a voltage drop caused by the high resistance of the second electrode 240.

Figure 17:
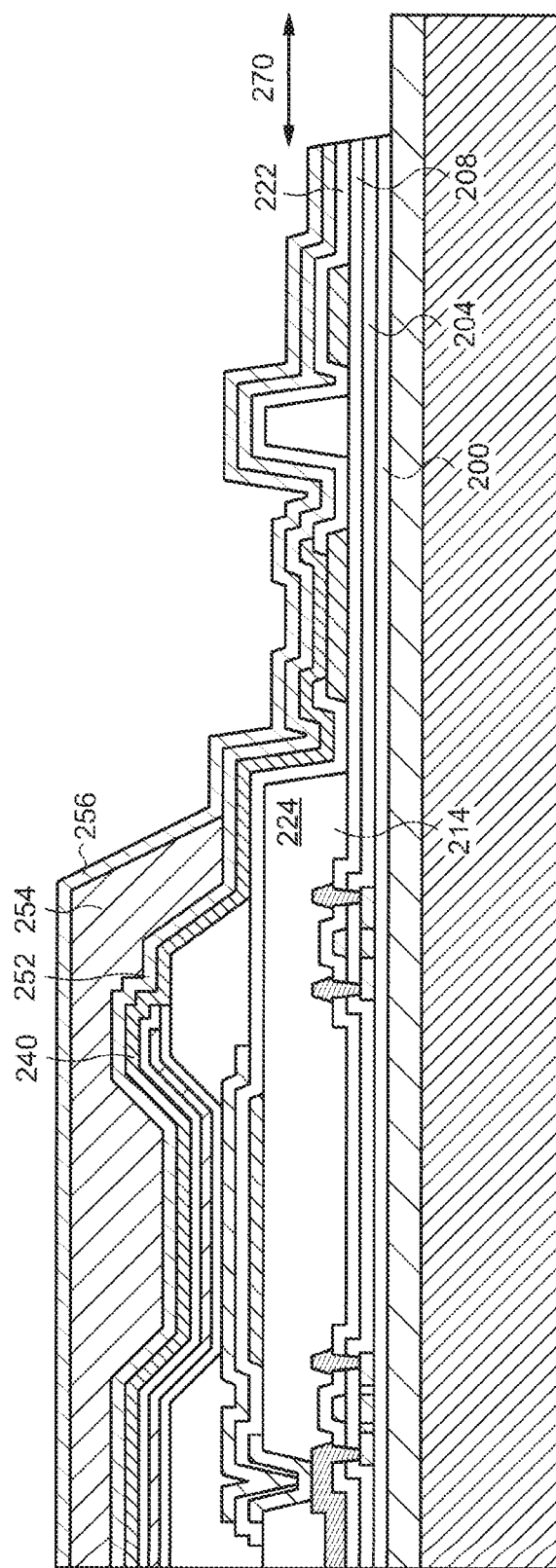
FIG. 17 is a schematic cross-sectional view explaining a manufacturing method of a display device according to an embodiment of the present invention.

Next, the passivation film 250 is formed. As shown in FIG. 17, the first layer 252 is first formed to cover the second electrode 240. The first layer 252 may be formed to cover the partition wall 224 and the leveling film 214 and be in contact with the insulating film 222. The first layer 252 may include an inorganic material such as silicon nitride, silicon oxide, silicon nitride oxide, and silicon oxynitride and may be formed by applying a CVD method or a sputtering method, for example.

Next, the second layer 254 is formed (FIG. 17). The second layer 254 may include an organic resin including an acrylic resin, a polysiloxane, a polyimide, and a polyester. As shown in FIG. 17, the second layer 254 may be formed so as to absorb depressions and projections caused by the partition wall 224 and to give a flat surface. It is preferred that the second layer 254 be formed so as not to cover the edge portion of the first layer 252. The second layer 254 may be formed with a wet-type film-formation method. Alternatively, the second layer 254 may be formed by atomizing or gasifying oligomers serving as a raw material of the aforementioned polymer material under a reduced pressure, spraying the first layer 252 with the oligomers, and then polymerizing the oligomers.

After that, the third layer 256 is formed (FIG. 17). The third layer 256 may include a material usable in the first layer 252 and can be formed with a method applicable to the formation of the first layer 252. The third layer 256 may be formed so as to be in contact with not only the second layer 254 but also the first layer 252.

In FIG. 17, a structure is demonstrated in which the sidewalls of the first layer 252 and the third layer 256 overlap with the sidewalls of the insulating films such as the undercoat 200, the gate insulating film 204, and the interlayer films 208 and exist in the same plane. Such a structure can be formed by forming the first layer 252 so as to cover the region 270 (that is, so as to be in contact with the flexible substrate 102), forming the third layer 256 so as to overlap with the first layer 252 in the region 270, and then partially removing the first layer 252 and the third layer 256 with etching, for example. In this case, the first layer 252 and the third layer 256 are formed so as to cover the terminals 122. However, the terminals 122 can be exposed by removing the first layer 252 and the third layer 256 simultaneously when etching for exposing the flexible substrate 102 is performed.

Figure 18:
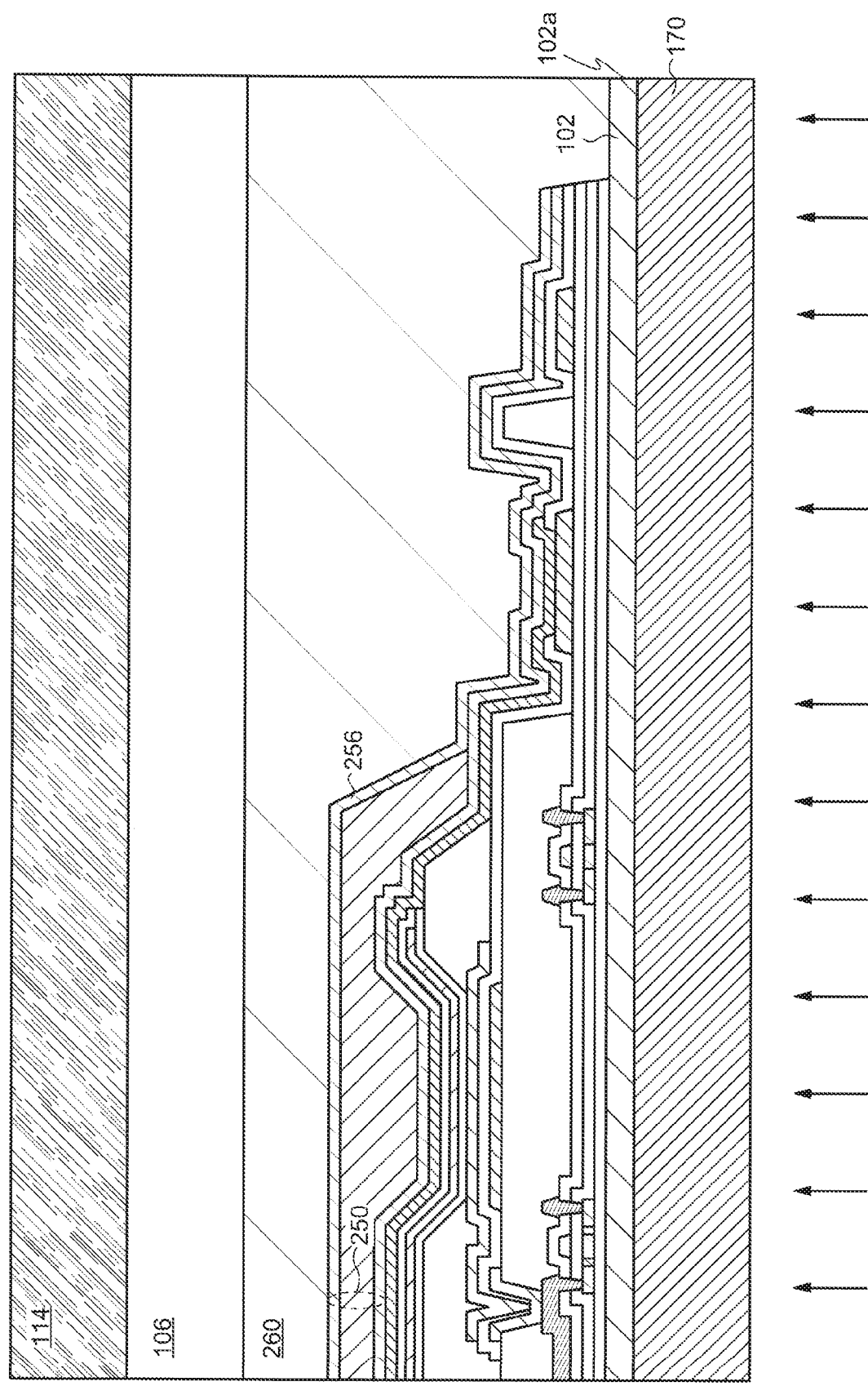
FIG. 18 is a schematic cross-sectional view explaining a manufacturing method of a display device according to an embodiment of the present invention.

After that, the cap film 106 is fixed over the passivation film 250 by using the adhesion layer 260 (FIG. 18). As the adhesion layer 260, an acrylic-based adhesive, an acrylate-based adhesive, or the like can be used. The polarizing plate 114 is further bonded over the cap film 106.

Figure 19:
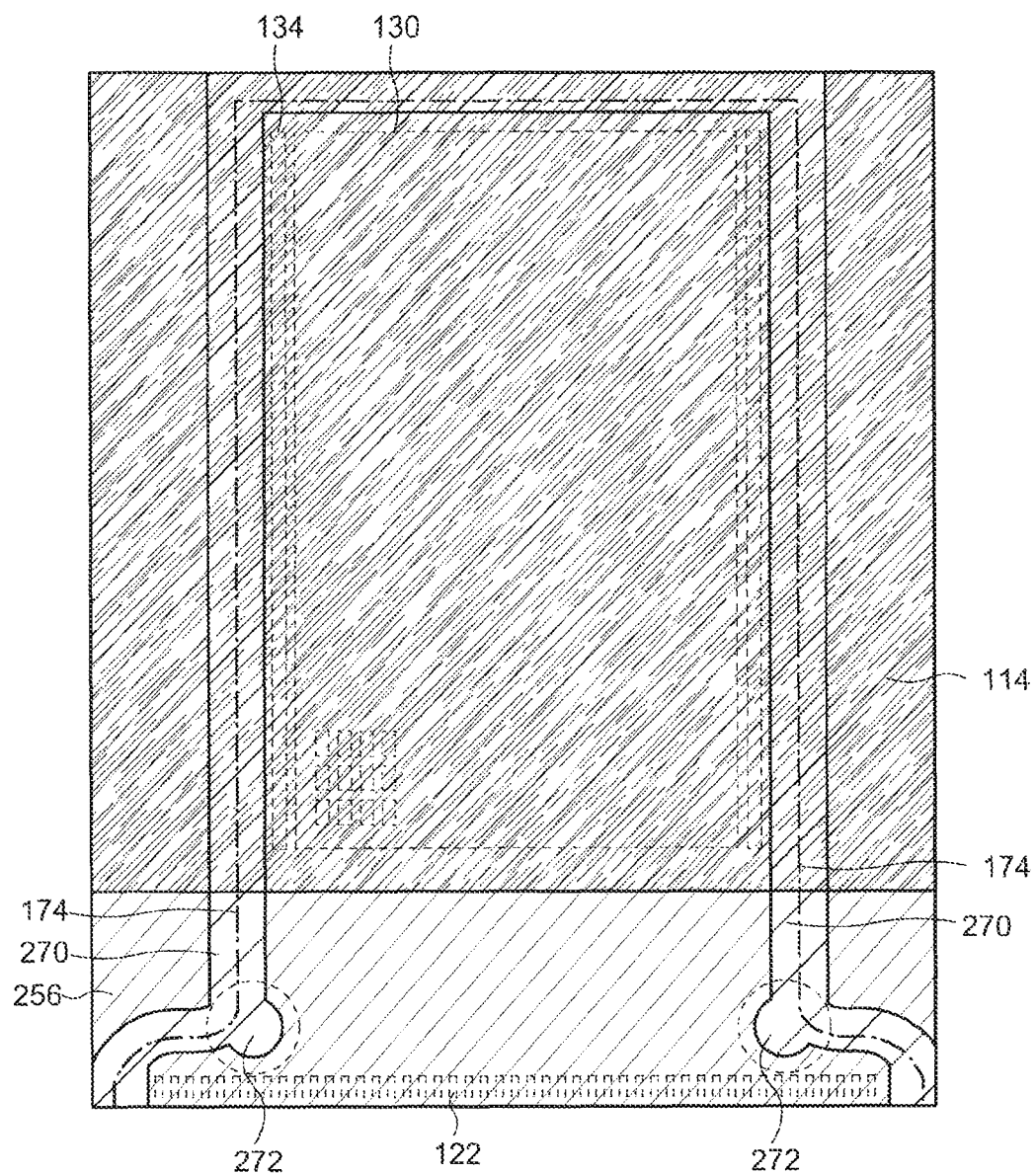
FIG. 19 is a schematic top view explaining a manufacturing method of a display device according to an embodiment of the present invention.
Figure 20:
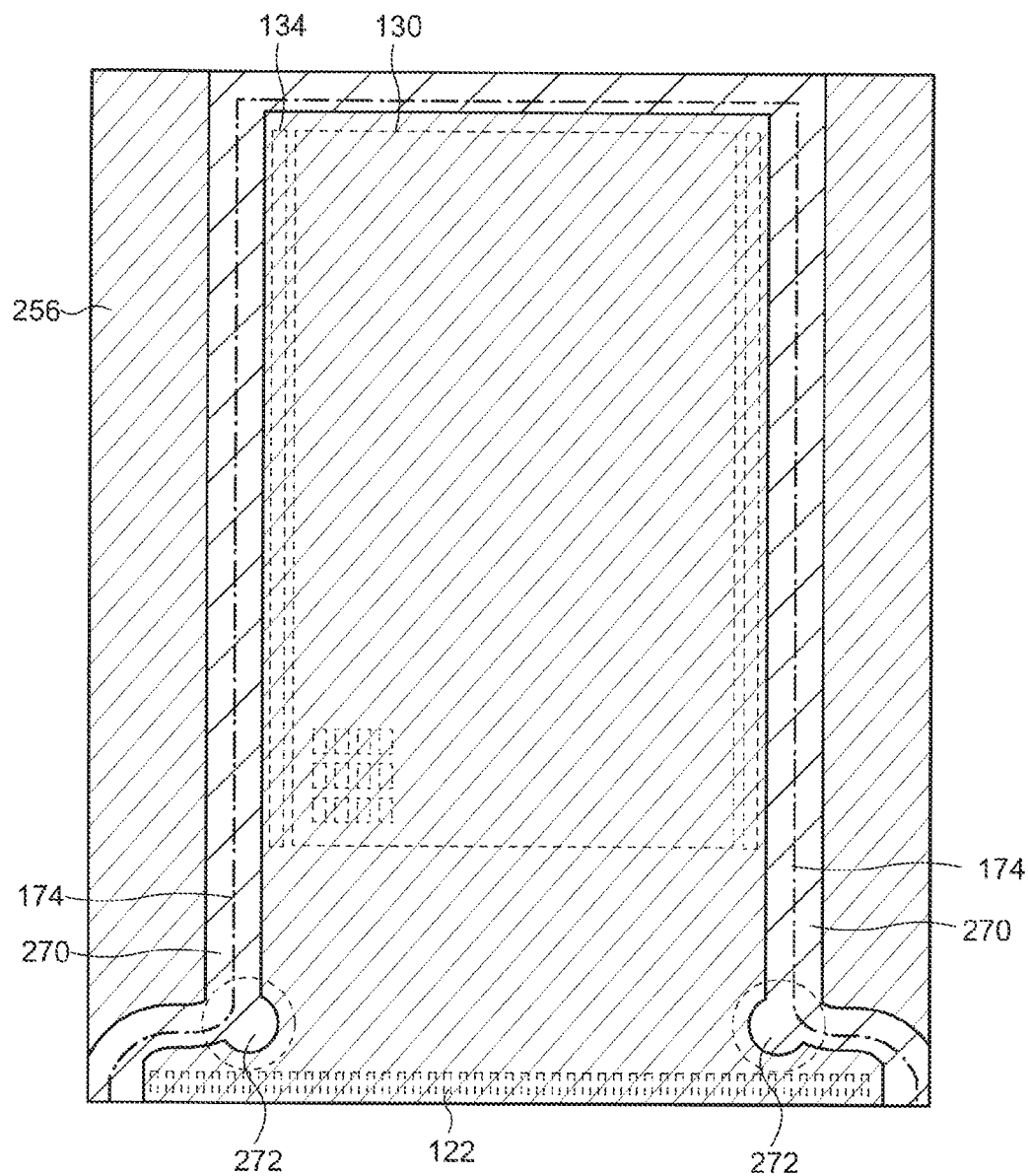
FIG. 20 is a schematic top view explaining a manufacturing method of a display device according to an embodiment of the present invention.

Through the aforementioned steps, the basic structure of the plurality of display devices 100 is completed over the mother glass 170. Next, the mother glass is preliminarily cut to preliminarily provide the individual display devices 100. Specifically, the mother glass 170 is preliminarily cut along chain lines 172 shown in FIG. 10. Top views of the basic structure of the display device 100 obtained by the preliminary cutting are shown in FIG. 19 and FIG. 20. The uppermost layer is the polarizing plate 114 in FIG. 19. The polarizing plate 114, the cap film 106, and the adhesion layer 260 are not illustrated, and the third layer 256 exists in the uppermost layer in FIG. 20. In each drawing, the display region 130, the driver circuit 134, and the terminals 122 are represented by dotted lines.

The shape obtained by preliminarily cutting the mother glass 170 is larger than the ultimate shape of the display device 100. After the preliminary cutting, trimming is performed along a cutline 174 shown by the chain lines in FIG. 19 and FIG. 20 to abstract the display device 100. Therefore, the cutline 174 corresponds to the edge 102a. Hence, as shown in FIG. 19 and FIG. 20, at least one of the insulating films (i.e., the undercoat 200, the gate insulating film 204, the interlayer film 208, the insulating film 222, the first layer 252, the second layer 254, and the third layer 256 of the passivation film 250, the leveling film 214, and the partition wall 224) is partly removed from the edge 102a in the active region 104 and the wiring region 135 inside the cutline 174, resulting in the region 270. At the same time, a part of the aforementioned insulating films is removed to form the cutoff 272 in a portion where the cutline 174 is curved (a region surrounded by a dotted circle in the drawing). Here, the cutoff 272 has a curved shape expressed by a part of a circle. Therefore, the region 270 has a shape depressed inside the flexible substrate 102 so as to surround the curved portion.

Figure 21:
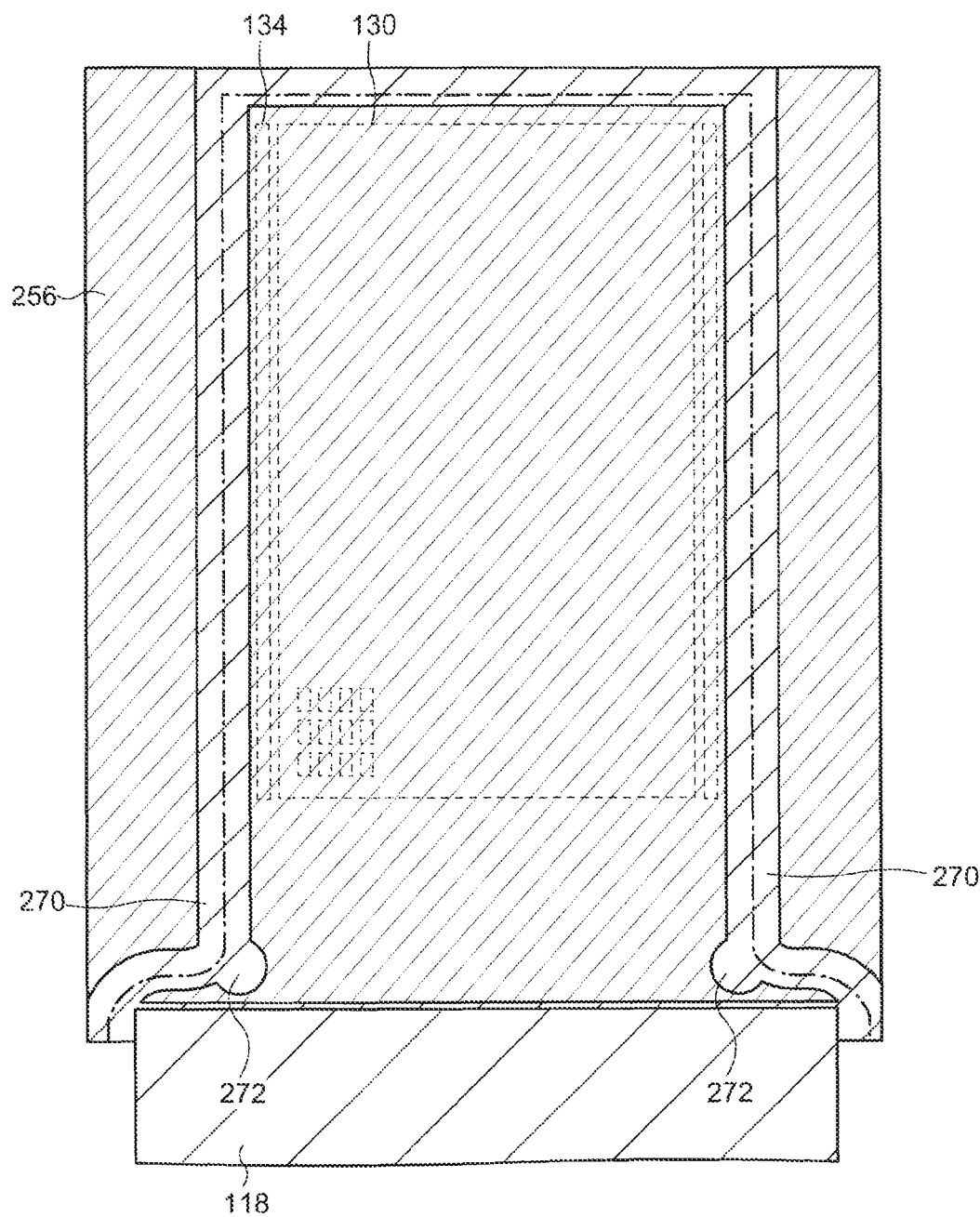
FIG. 21 is a schematic top view explaining a manufacturing method of a display device according to an embodiment of the present invention.

A specific example of the steps is explained below. After the mother glass 170 is preliminarily cut, the insulating films (e.g., the first layer 252, third layer 256, the insulating film 222, or the like) covering the terminals 122 are removed to expose the terminals 122, and the connector 118 is bonded to the exposed terminal 122 (FIG. 21). Although not shown, the IC chip 120 may be mounted before or after the connector 118 is bonded. Additionally, the resin layer 108 may be formed. Note that the polarizing plate 114 and the cap film 106 are not illustrated in FIG. 21.

Next, the mother glass 170 is separated. Specifically, as indicated by linear arrows of FIG. 18, light such as a laser is applied from a side of a bottom surface of the mother glass 170 to reduce the adhesion between the mother glass 170 and the flexible substrate 102. After that, the mother glass 170 is peeled from the flexible substrate 102 at an interface therebetween by utilizing physical force. With this step, a bottom surface of the flexible substrate 102 is exposed.

Figure 22:
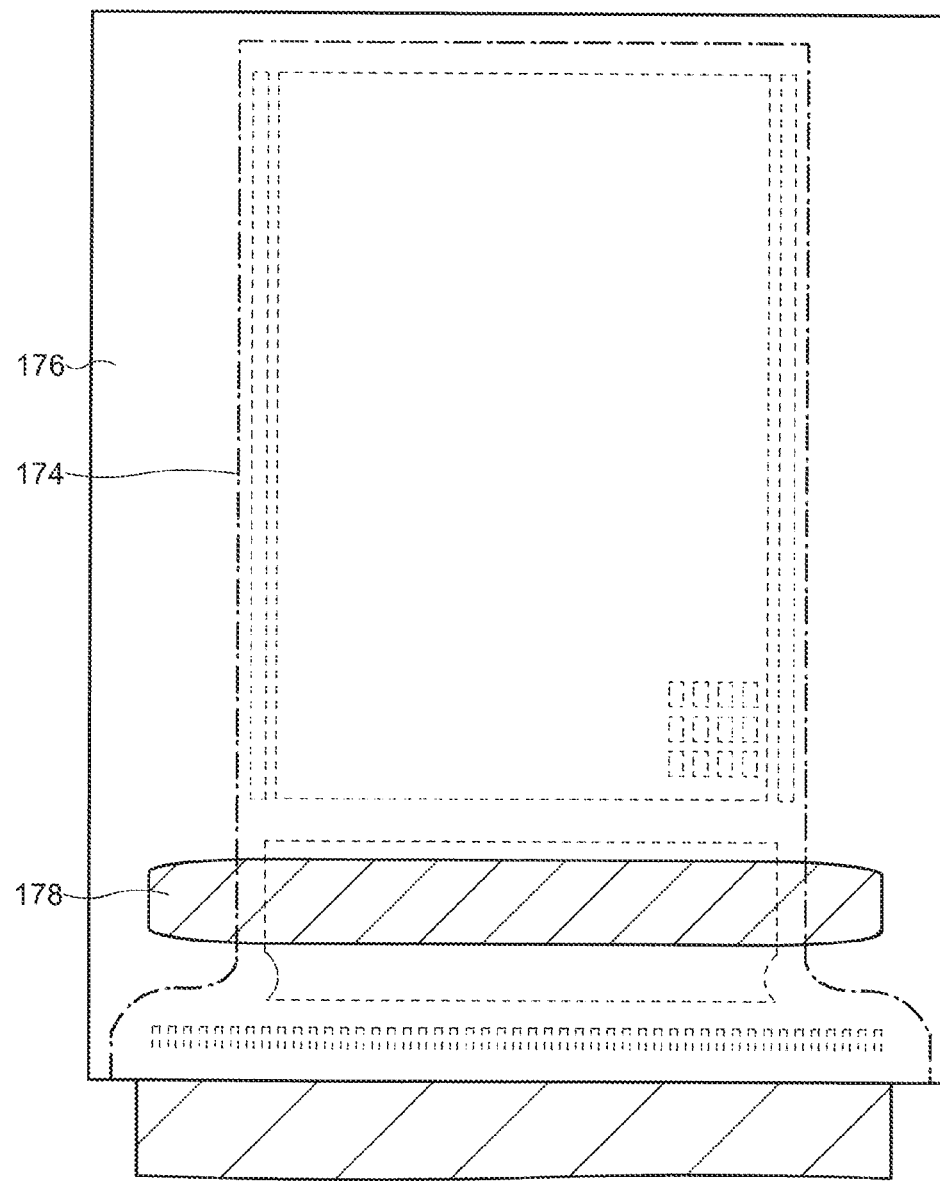
FIG. 22 is a schematic bottom view explaining a manufacturing method of a display device according to an embodiment of the present invention.

Next, the first base film 110 and the second base film 112 are formed. A specific method is shown in FIG. 22. FIG. 22 is a bottom view of the structure shown in FIG. 21. A lamination film 176 having an opening portion 178 is bonded to the bottom surface of the flexible substrate 102. The bonding is carried out by using an acrylic-based or epoxy-based adhesive, and a film including a polyester such as poly(ethylene terephthalate), a polyolefin, a polycarbonate, or the like may be used as the lamination film 176. The lamination film 176 is selected and bonded so that the cutline 174 traverses the opening portion 178 twice.

After bonding the lamination film 176, trimming is performed along the cutline 174. The trimming may be conducted by moving a cutter along the cutline 174 or pressing a cutter processed into the shape of the cutline 174 from over the flexible substrate 102. Through these steps, the display device 100 is manufactured.

As described above, the ultimate shape of the display device 100 is determined by trimming along the cutline 174. Since the insulating films included in the active region 104 and the wiring region 136 are readily deformed by the physical force applied via the cutter during trimming, a crack is readily caused therein. If the crack reaches the driver circuit 134, the display region 130, or the wiring region 124, the wirings are disconnected or deteriorated, and the seal structure is broken. As a result, defects such as abnormal transmittance of the image signals and loss of the display function in a part of the pixels are caused, and the display device 100 loses the function as a display device.

Figure 23:
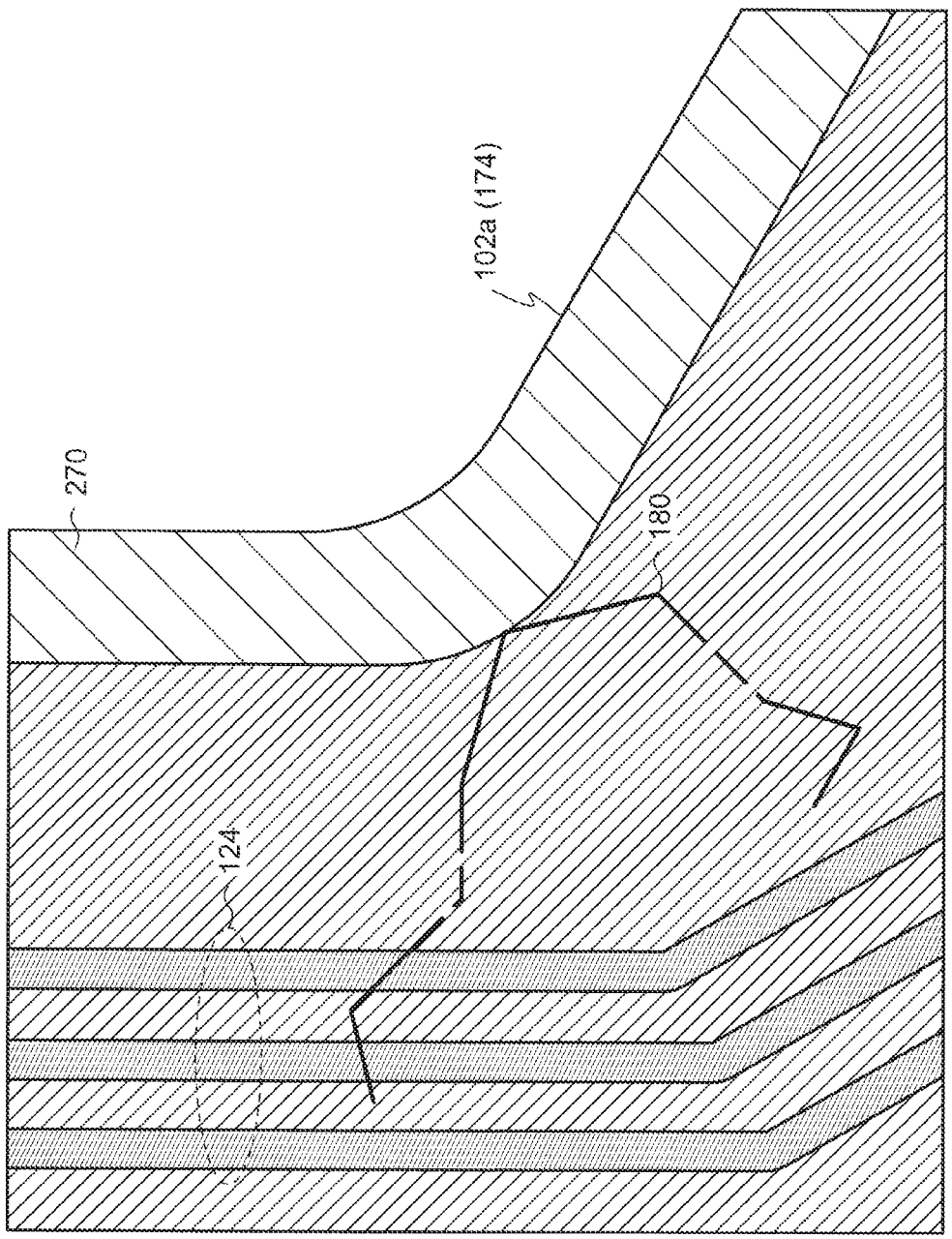
FIG. 23 is an enlarged top view of a display device.

Hence, the insulators are partly removed from the side of the cutline 174 to form the region 270, and then trimming is carried out along the cutline 174. However, it is difficult to completely suppress the generation of cracks even if the region 270 is prepared. Particularly, a crack 180 is readily caused in the portion exemplified by the region 142 where the cutline 174 is curved or bent (FIG. 23). This is probably because stress during trimming is localized in the portion where the cutline 174 is curved.

However, as described in the First and Second Embodiments, it is possible to inhibit generation of the crack 180 by forming the region 270 so as to surround the curved portion of the cutline 174, that is, the curved portion of the edge 102a of the flexible substrate 102 and to have the shape depressed inside the flexible substrate 102. This is probably because the distance from the edge 102a where a crack is readily caused to the sidewalls of the insulating films is increased. Accordingly, the flexible display device 100 can be manufactured at a high yield, and reliability of the display device 100 can be increased.

Third Embodiment

In the present embodiment, a display device 300 having structures different from those of the display device 100 described in the First Embodiment is explained. An explanation regarding the structures the same as those of the display device 100 may be omitted.

In the display device 300, the sidewalls of the insulating films included in the active region 104 are curved in a region where an edge 110a of the first base film 110 or an edge 112a of the second base film 112 intersect the insulating films. The sidewalls are curved in the plane on which the wirings 124 are formed. Furthermore, the distance L from the edge 102a to the sidewalls varies so that the plot of the distance L against the position on the edge 102a is expressed by a curve.

Figure 24A:
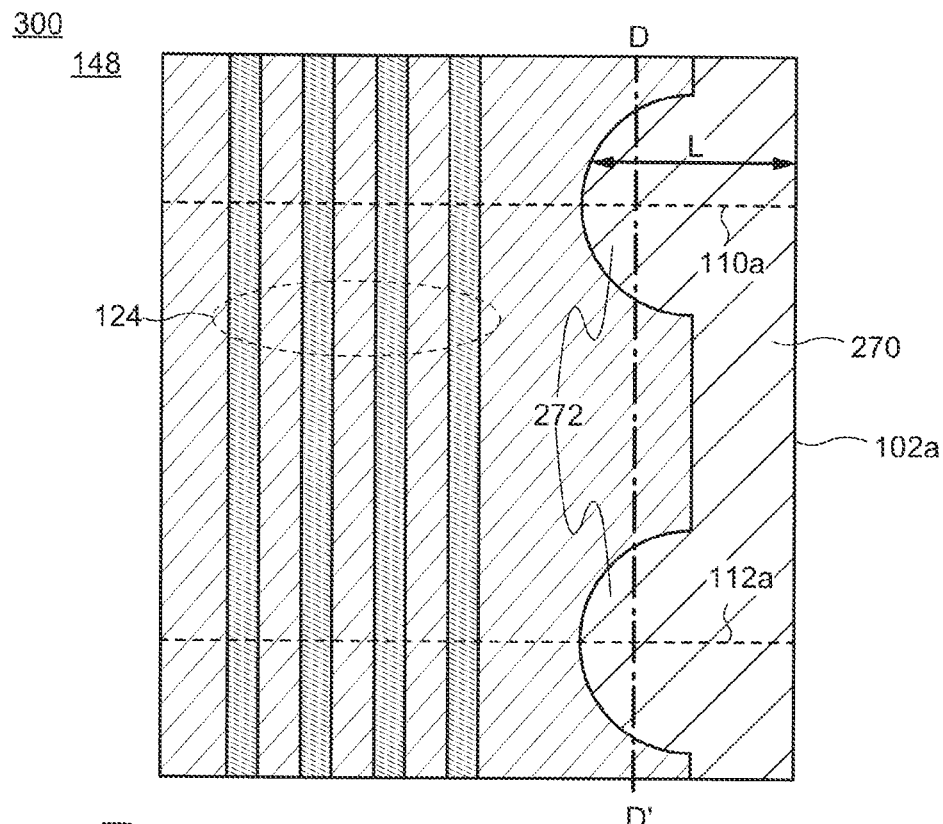
FIG. 24A is an enlarged top view of a display device and FIG. 24B is an enlarged top view of a display device according to an embodiment of the present invention.

A specific structure is shown in FIG. 24A and FIG. 25. FIG. 24A is a drawing schematically representing the region 148 in FIG. 2, and a schematic cross-sectional view along a chain line D-D' of FIG. 24A is FIG. 25. As shown in FIG. 24A, the wirings 124 extending from the active region 104 extend linearly in the region 148. As shown in FIG. 24A and FIG. 25, at least one of the insulating films is partly removed from the edge 102a in the region 148, and the sidewalls of the insulating films have a curved portion in the plane on which the wirings 124 are formed. That is, the insulating films possess a cutoff 272 intersecting the edges 110a and 110b. The curved portion intersects the edge 110a of the first base film 110 or the edge 112a of the second base film 112. Therefore, as shown in FIG. 24A, the distance L between the sidewalls of the insulating films and the edge 102a continuously varies in the region where the sidewalls intersect the edge 110a of the first base film 110 or the edge 112a of the second base film 112. Similar to the First Embodiment, this variation is expressed by a curve with respect to the position on the edge 102a, and the slope (derivative) of the plot of the distance L with respect to the position on the edge 102a continuously varies.

In the present embodiment, an example is demonstrated as shown in FIG. 25 where all of the undercoat 200, the gate insulating film 204, the interlayer film 208, the insulating film 222, the first layer 252, and the third layer 256 are partly removed from the edge 102a to form the region 270, and the sidewalls of these films exist in the same plane. Moreover, the flexible substrate 102 is in contact with the resin layer 108 in the region 270. However, the present embodiment is not limited to this mode, and at least one of the insulating films located in the active region 104 may be partly removed from the edge 102a and the sidewall thereof may have the aforementioned structure.

Figure 24B:
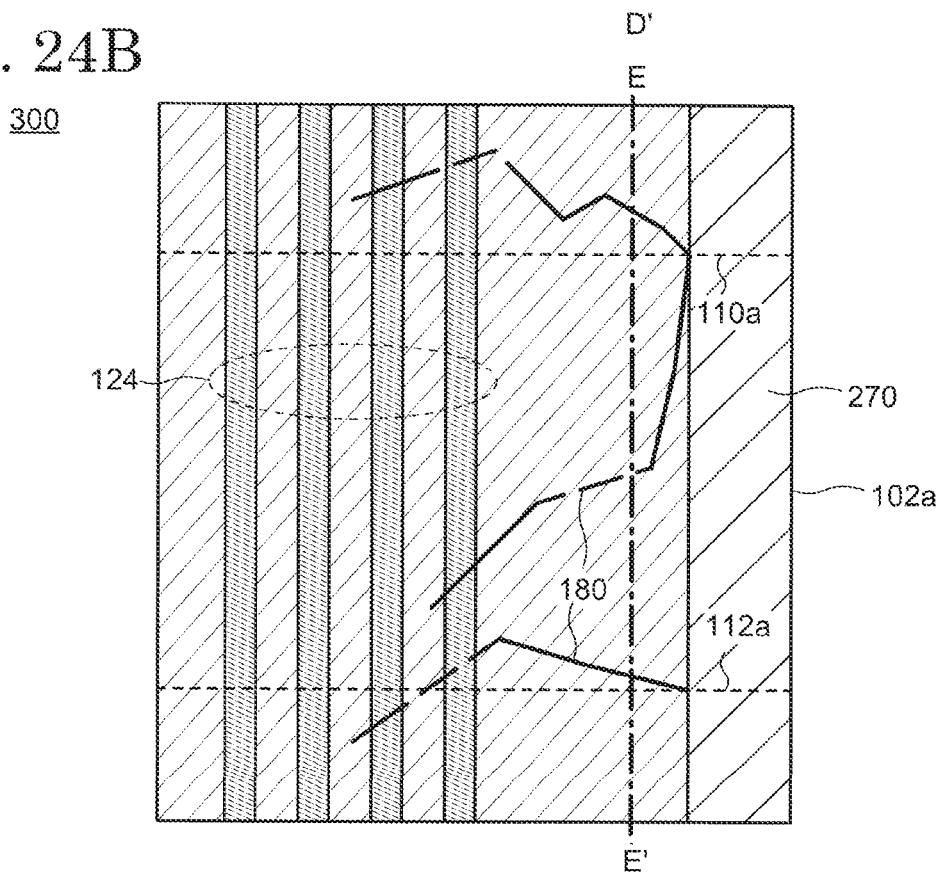
Figure 26:
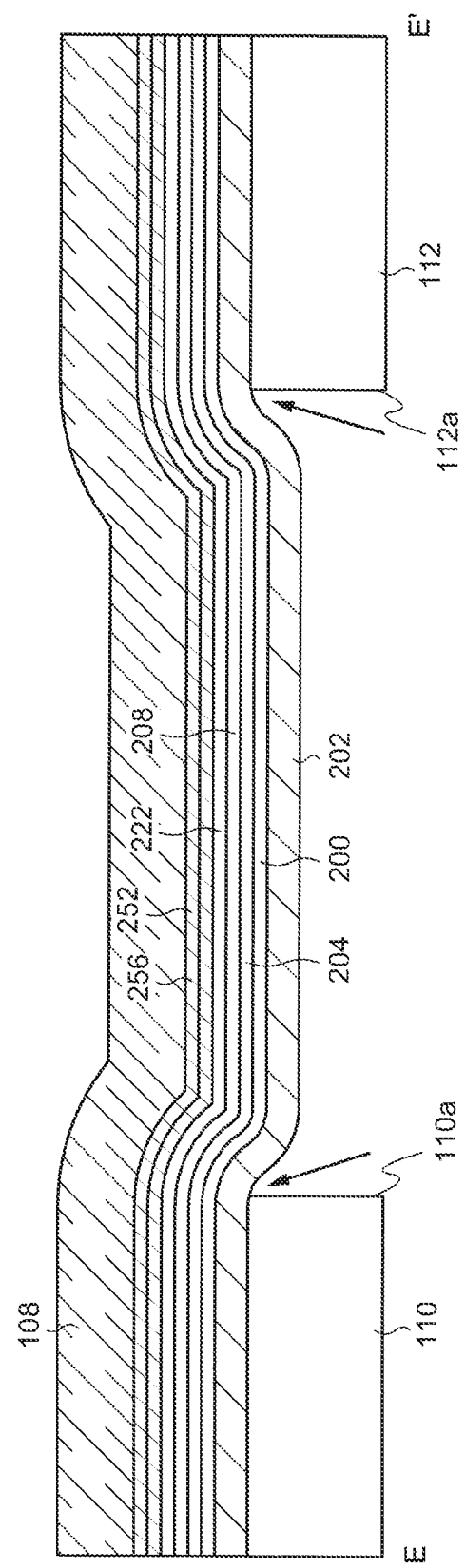
FIG. 26 is a schematic cross-sectional view of a display device.

In the case where the width of the region 270 is constant, that is, in the case where the sidewalls of the partly removed insulating films are parallel to the edge 102a, cracks 180 may be caused in the insulating films at the intersections with the edge 110a and the edge 112a as shown in FIG. 24B. This is because the flexible substrate 102 and the insulating films formed thereover are deformed during trimming along the cutline 174 and a large pressure is locally applied to the portions (the portions indicated by arrows in the drawing) in contact with the edge 110a and the edge 112a as shown FIG. 26 which is a cross-section along a chain line E-E' of FIG. 24B. Hence, as shown in FIG. 24B, the cracks 180 may be caused in the insulating films from the portions intersecting the edge 110a and the edge 112a and extend inside the flexible substrate 102.

However, generation of the cracks 180 can be prevented or the expansion of the cracks 180 can be inhibited by forming the curved portion in the sidewalls of the insulating films and arranging the curved portion to intersect the edge 110a and the edge 112a. Hence, the yield of the display device 100 can be improved, and reliability of the display device 100 can be increased.

Figure 27A:
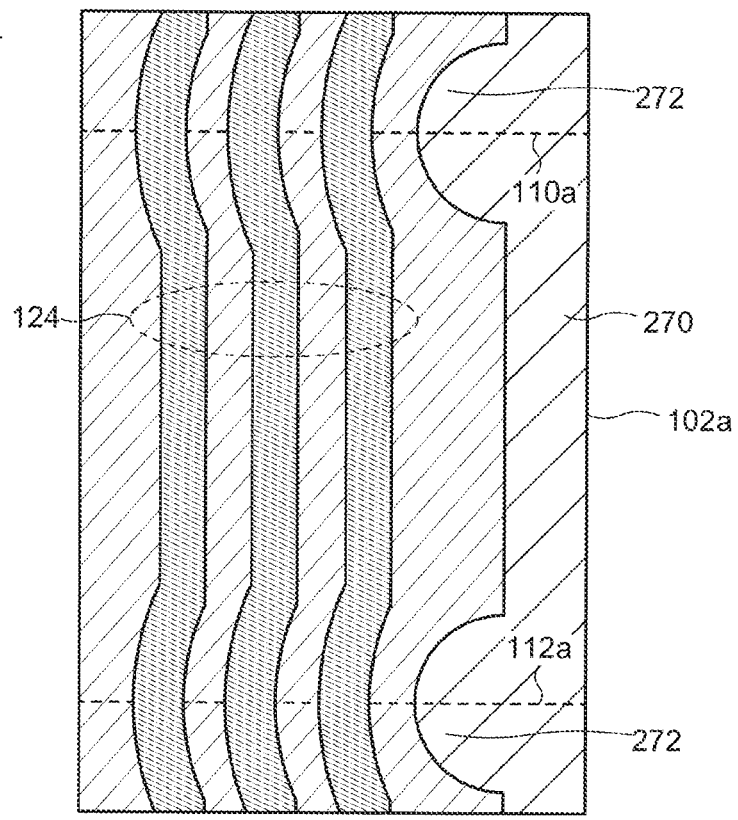
FIG. 27A and FIG. 27B are enlarged top views of a display device according to an embodiment of the present invention.

In the example shown in FIG. 24A, the wirings 124 have a linear shape in the region from the edge 110a to the edge 112a. However, the wirings 124 may have a curved shape so that the distance from the edge 102a is increased in the portion where the wirings 124 intersect the edge 110a and the edge 112a as shown in FIG. 27A. This curved shape is a shape depressed inside the flexible substrate 102 with respect to the edge 102a in the plane on which the wirings 124 are formed. Each wiring 124 may have a plurality of curved shapes and extend linearly between the curved shapes.

Figure 28:
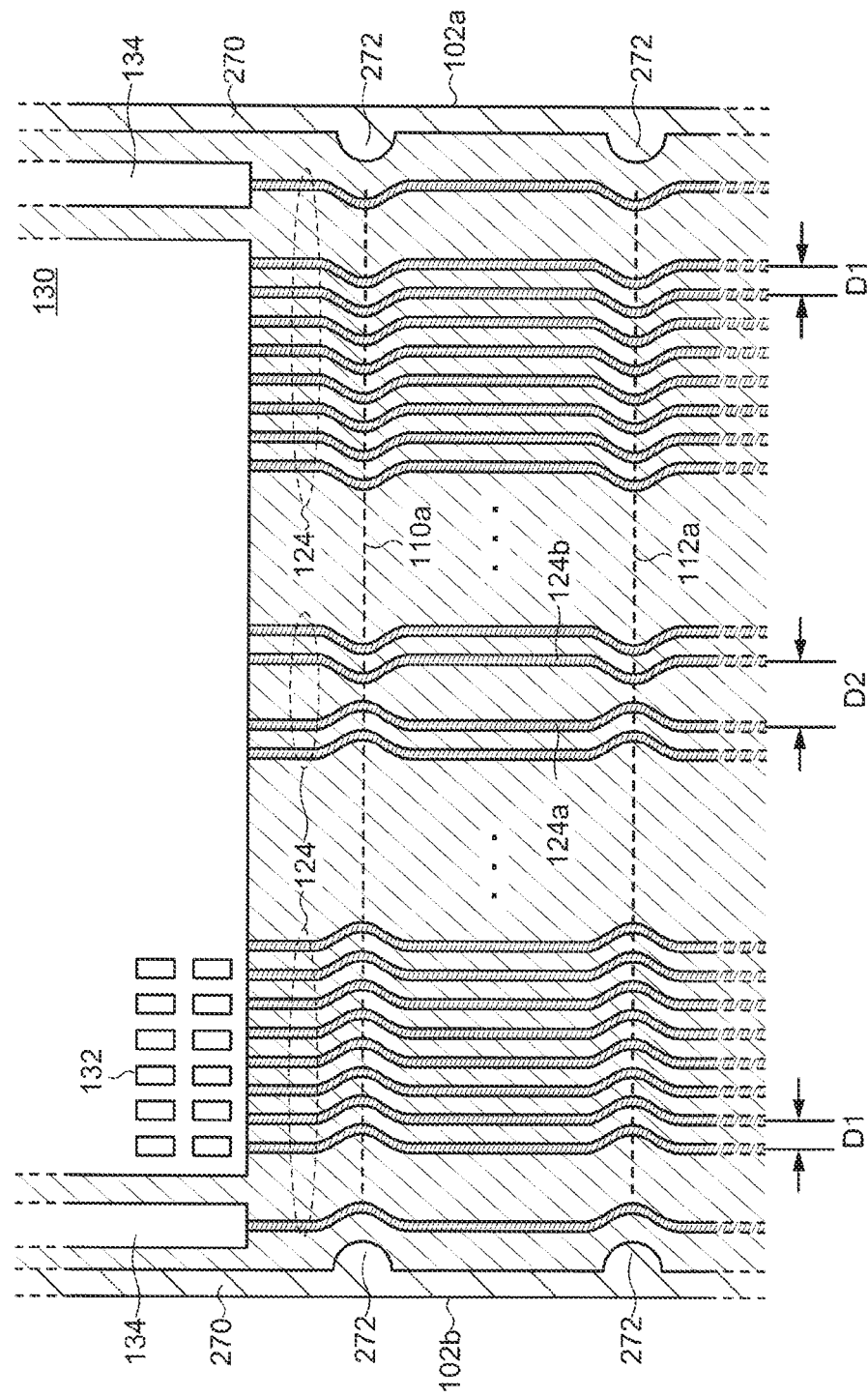
FIG. 28 is an enlarged top view of a display device according to an embodiment of the present invention.

The cutoff 272 may be formed on both sides of the flexible substrate 102. Specifically, the cutoffs 272 may be formed in the insulating films on both of the opposing sides of the flexible substrate 102 so as to intersect the edge 110a and the edge 110b as shown in FIG. 28. In this case, the cutoffs 272 intersecting one edge (e.g., the edge 110a) are in a symmetrical relationship, and the region 270 is formed so that the cutoffs 272 face towards the inside of the flexible substrate 102.

Therefore, according to the symmetrical relationship of the cutoffs 272 facing each other, the curved shape of the wirings 124 may be different depending on the position on the flexible substrate 102. Specifically, the curved portion of each wiring 124 may be arranged so as to be curved inward from the edge 102a and 102b of the flexible substrate 102 as shown in FIG. 28. For example, the curved portion of the wiring 124 which is closer to the second edge (e.g., the edge 102b) than the first edge (e.g., the edge 102a) opposing to the second edge is curved in a direction to the first edge (edge 102a). On the other hand, the curved portion of the wiring 124 closer to the edge 102b than the edge 102a is curved in a direction to the edge 102b. These wirings 124 are arranged to be symmetrical to one another with respect to a line parallel to a direction in which the wirings 124 extend.

In such a wiring arrangement, a pair of wirings 124 (the wirings 124a and 124b in FIG. 28) which are in a symmetrical relationship and adjacent to each other are disposed in a center or its vicinity of the flexible substrate 102. The curved direction of the curved portions of the wirings 124a and 124b are opposite to each other. Therefore, the wirings 124 may be arranged so that a distance D2 between the wirings 124a and 124b is larger than a distance D1 between the other wirings 124 in order to avoid contact of the curved portions. Specifically, the wirings 124 may be arranged so that the distance D2 is larger than the distance D1 between the wirings 124 which are adjacent to each other and whose curved portions are directed in the same direction.

Figure 27B:
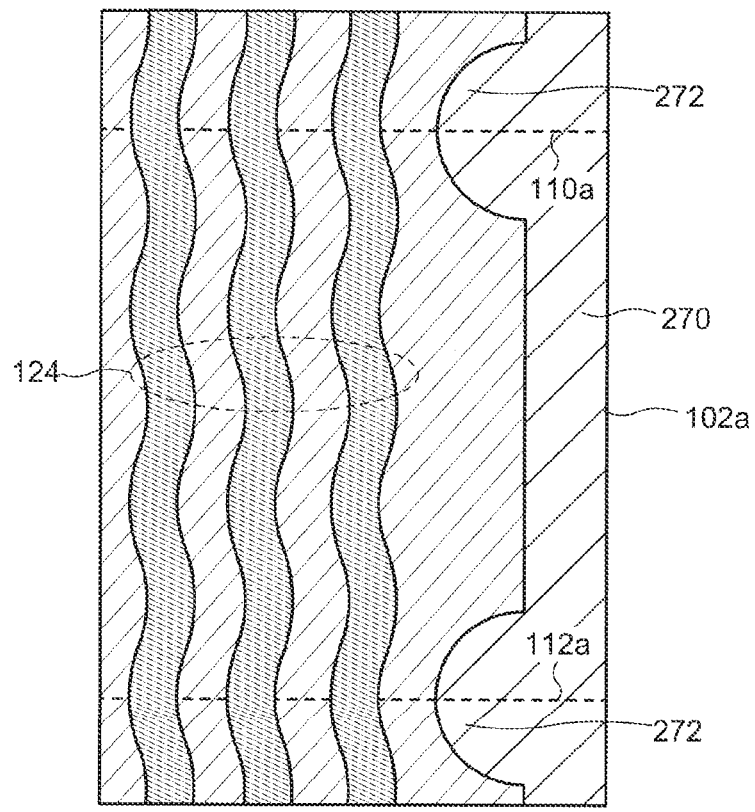

The curved shape of the wirings 124 is not limited to that shown in FIG. 27A. For example, the wirings 124 may maintain a wave shape in the entire region between the edge 110a and the edge 112a as shown in FIG. 27B. That is, the wirings 124 each may be substantially composed of a wave shape in the entire region between the edge 110a and the edge 112a and possess one or more inflection points.

When trimming is carried out along the cutline 174, the wirings 124 are also deformed due to the pressure from the cutter. However, the wave shape of the wirings 124 allows a reduction of a curvature of the deformed wiring 124, by which damage to the wirings 124 can be suppressed. As a result, disconnection of the wirings 124 can be prevented, thereby enabling production of the highly reliable display device 100.

Figure 29A:
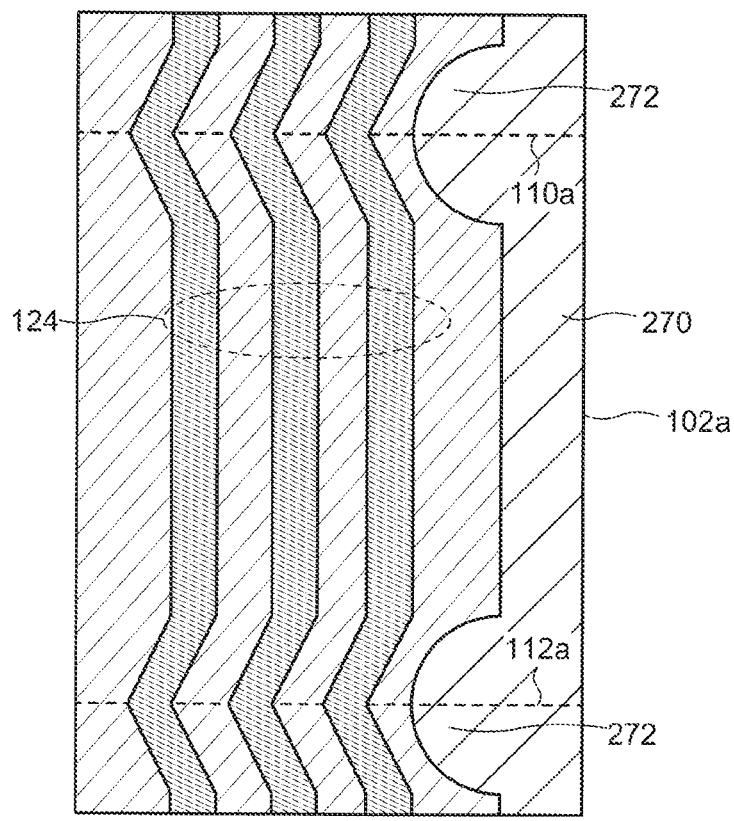
FIG. 29A and FIG. 29B are enlarged top views of a display device according to an embodiment of the present invention.

Alternatively, the wirings 124 may have a structure in which the portion intersecting the edge 110a or the edge 112a is folded in the plane on which the wirings 124 are formed so that the distance from the edge 102a is increased as shown in FIG. 29A. That is, the wirings 124 each have two linear portions having vectors different in direction from each other, and the linear portions are connected to each other in the portion intersecting the edge 110a or the edge 110b. In this case, the wirings 124 each may have a linear portion parallel to the edge 102a between the edge 110a and the edge 112a.

Figure 29B:
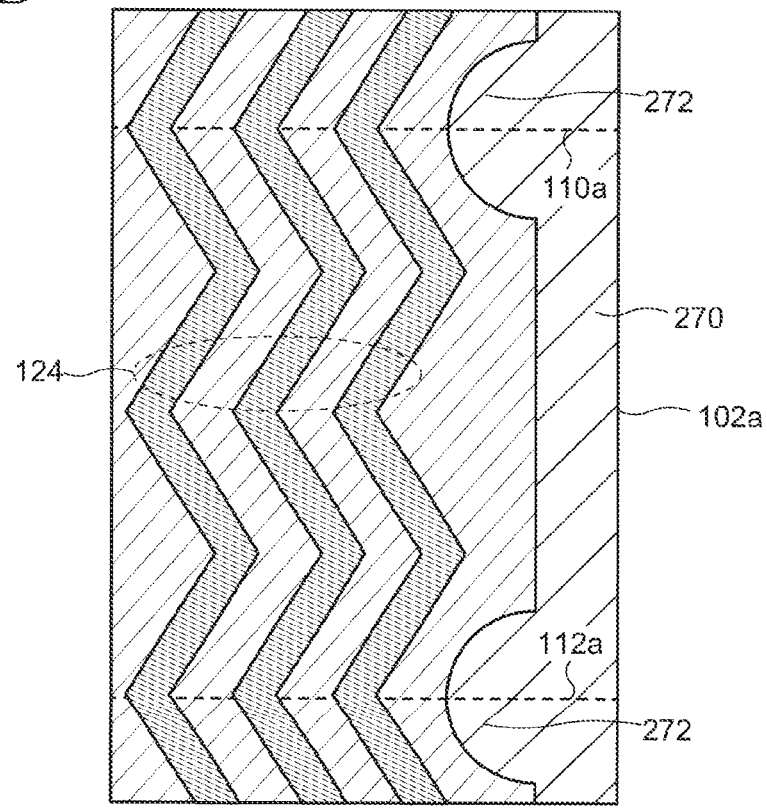

Alternatively, the wirings 124 each may have a zig-zag shape in the entire region between the edge 110a and the edge 112a as shown in FIG. 29B. In this case, the wirings 124 are each composed of a plurality of linear portions between the edge 110a and the edge 112a, and these linear portions are inclined from the edge 102a.

The wirings 124 having the structures shown in FIG. 29A and FIG. 29B each have a vector component inclined from the edge 102a at the intersecting portions with the edge 110a or the edge 112a. Therefore, even if the pressure is applied during trimming, the curvature of the deformed wirings 124 can be reduced by which damage to the wirings 124 can be suppressed. As a result, disconnection of the wirings 124 can be prevented, thereby enabling production of the highly reliable display device 100.

Fourth Embodiment

In the present embodiment, a display device 310 having structures different from those of the display device 100 is explained. An explanation regarding the structures the same as those shown in the First to Third Embodiments may be omitted.

Figure 30:
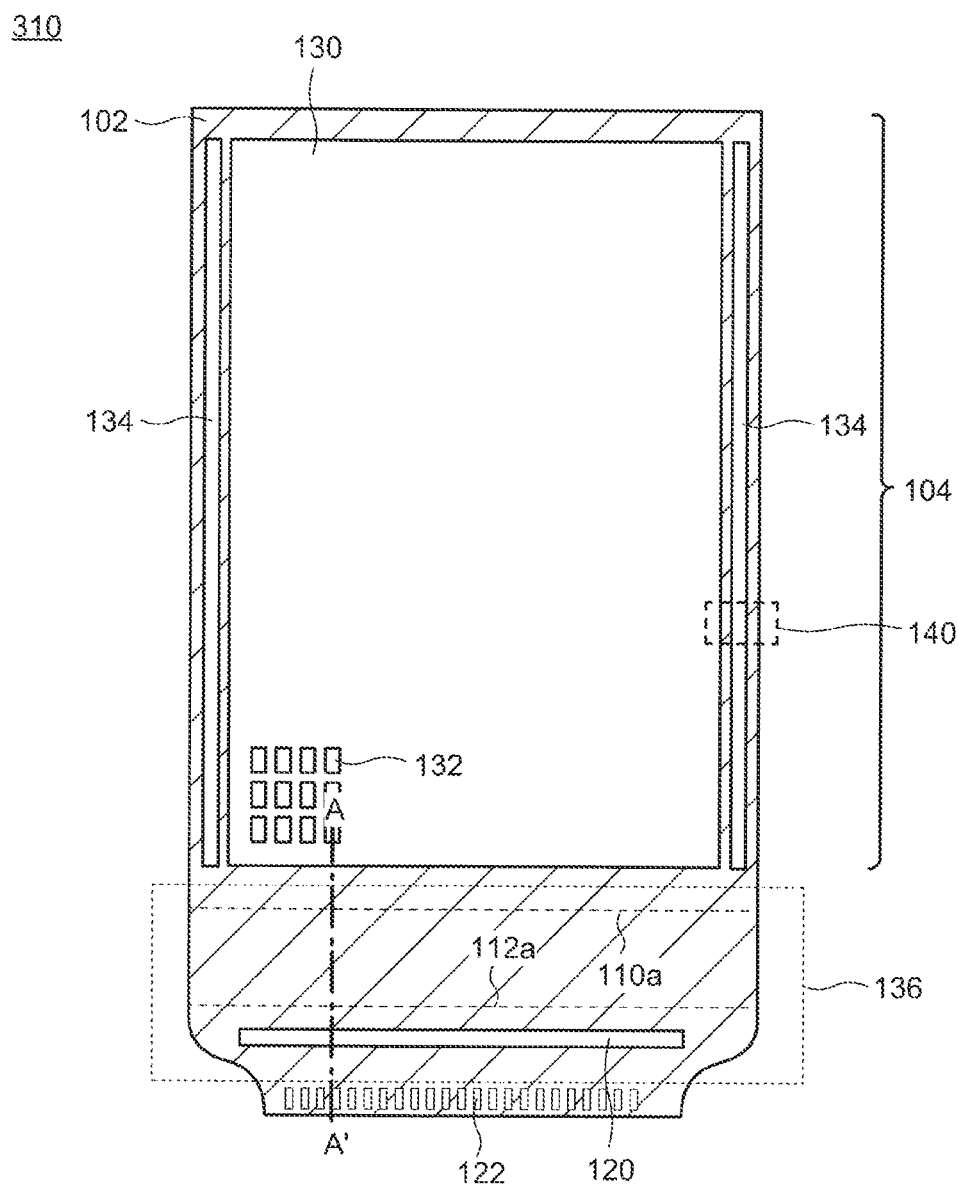
FIG. 30 is a schematic top view of a display device according to an embodiment of the present invention.

Similar to the display device 100, the width of the flexible substrate 102 of the display device 310 is not constant in the wiring region 136, and the flexible substrate 102 have a portion in which the width continuously varies. However, unlike the display device 100, the width of the wiring region 136 closer to the terminals 122 than the active region 104 is smaller than that closer to the active region 104 than the terminals 122 as shown in FIG. 30.

Figure 31:
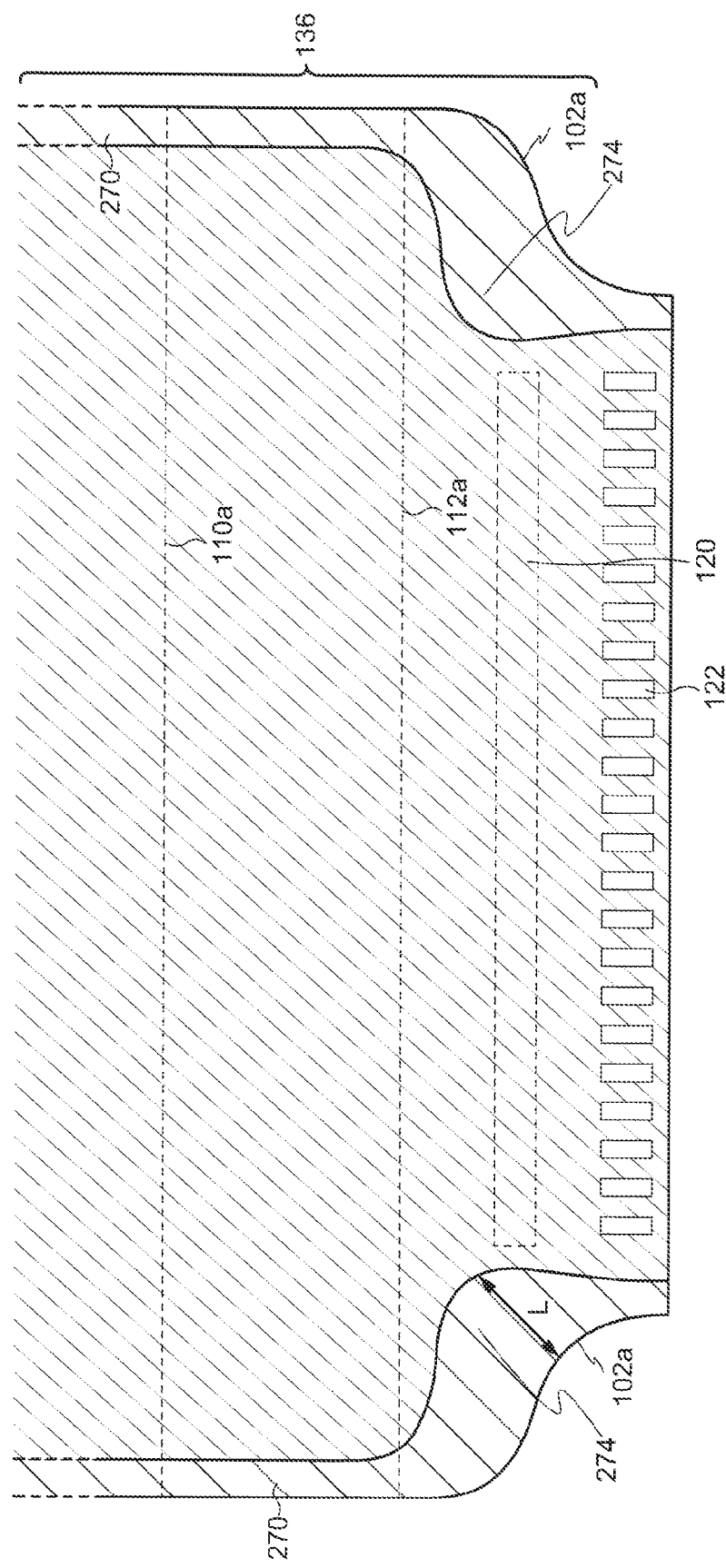
FIG. 31 is an enlarged top view of a display device according to an embodiment of the present invention.

Therefore, a part of the edge 102a of the flexible substrate 102 is curved. In the curved region, the region 270 formed by removing all of or a part of the insulating films has a shape depressed inside the flexible substrate 102 in the plane on which the wirings 124 are formed so as to surround the curved portion as shown in FIG. 31. That is, all of or a part of the insulating films are scooped and have a cutoff 274 so as to surround at least a part of the curved portion of the edge 102a. Hence, the distance L between the edge 102a and the sidewalls of the partly removed insulating films is not constant but varies in the portion where the edge 102a is curved. This variation is the same as that of the display device 100.

Although not shown, similar to the display device 300, the region 270 may have the cutoff 272 intersecting the edge 110a of the first base film 110 and the edge 112a of the second base film 112.

Similar to the display device 100, it is possible to inhibit generation of a crack during trimming by partly removing one or both of the insulating films including an inorganic compound and the insulating films including an organic compound to form the cutoff 274 in a vicinity of the curved edge 102a. As a result, not only can a manufacturing yield of a display device be improved but also a highly reliable display device can be provided.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A flexible substrate comprising:
a substrate including an active region, a plurality of terminals configured to be connected to a printed circuit board, and a wiring region comprising a plurality of wirings connected to the plurality of terminals and located between the plurality of terminals and the active region; and
an insulating film overlapping with the plurality of wirings in the wiring region,
wherein, in the wiring region, the insulating film has a sidewall between an edge of the substrate and the plurality of wirings, and
wherein the sidewall has a first cutoff portion, a second cutoff portion, and a straight portion between the first cutoff portion and the second cutoff portion.

2. The flexible substrate according to claim 1,
wherein one of the plurality of wirings has a first bent portion, and the first bent portion and the first cutoff portion are arranged on a first line.

3. The flexible substrate according to claim 2,
wherein the one of the plurality of wirings further has a second bent portion, and the second bent portion and the second cutoff portion are arranged on a second line.

4. The flexible substrate according to claim 1,
wherein the first cutoff portion and the second cutoff portion are curved.

5. The flexible substrate according to claim 1,
wherein a distance between the edge of the substrate in the wiring region and the sidewall varies so that a plot of the distance against a position on the second edge is expressed with a curve.

6. The flexible substrate according to claim 1,
wherein the substrate is configured to be folded in the wiring region so that the substrate and the printed circuit board are overlapped.

7. A flexible substrate comprising:
a substrate having an active region and a wiring region,
a plurality of transistors arranged in the active region;
a plurality of terminals configured to be connected to a printed circuit board;
a plurality of wirings arranged in the wiring region and extended from the active region to the plurality of terminals; and
an insulating film formed in the active region and overlapping with the plurality of wirings in the wiring region,
wherein, in the wiring region, the insulating film has a sidewall between an edge of the substrate and the plurality of wirings, and
wherein the sidewall has a first cutoff portion, a second cutoff portion, and a straight portion between the first cutoff portion and the second cutoff portion.

8. The flexible substrate according to claim 7,
wherein the straight portion is parallel to the edge of the substrate.

9. The flexible substrate according to claim 7,
wherein one of the plurality of wirings has a first bent portion, and the first cutout portion is arranged between the first bent portion and the edge of the substrate.

10. The flexible substrate according to claim 7,
wherein the first cutoff portion and the second cutoff portion are curved.

11. The flexible substrate according to claim 7,
wherein a distance between the edge of the substrate and the sidewall varies in the wiring region so that a plot of the distance against a position on the second edge is expressed with a curve.

12. The flexible substrate according to claim 7,
wherein the insulating film is an inorganic film.

13. The flexible substrate according to claim 7,
wherein the insulating film is an organic film.

14. The flexible substrate according to claim 7, further comprising a resin overlapping with the insulating film in the wiring region, the resin further overlapping with the substrate in a region between the edge of the substrate and the sidewall of the insulating film.

15. The flexible substrate according to claim 14,
wherein the insulating film is an inorganic film.

16. The flexible substrate according to claim 14,
wherein the insulating film is an organic film.

17. The flexible substrate according to claim 14,
wherein the substrate is configured to be folded in the wiring region so that the substrate and the printed circuit board are overlapped with each other.

18. The flexible substrate according to claim 7,
wherein the substrate is configured to be folded in the wiring region so that the substrate and the printed circuit board are overlapped with each other.

* * * * *